United States Patent
Li et al.

(10) Patent No.: US 11,049,807 B2
(45) Date of Patent: Jun. 29, 2021

(54) THREE-DIMENSIONAL MEMORY DEVICE CONTAINING TUBULAR BLOCKING DIELECTRIC SPACERS

(71) Applicant: SANDISK TECHNOLOGIES LLC, Addison, TX (US)

(72) Inventors: Li Li, Nagoya (JP); Yuki Kasai, Kuwana (JP); Tatsuya Hinoue, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/582,262

(22) Filed: Sep. 25, 2019

(65) Prior Publication Data

US 2021/0090992 A1 Mar. 25, 2021

(51) Int. Cl.
*H01L 29/76* (2006.01)
*H01L 23/522* (2006.01)
(Continued)

(52) U.S. Cl.
CPC ...... *H01L 23/5226* (2013.01); *H01L 27/1157* (2013.01); *H01L 27/11565* (2013.01); *H01L 27/11582* (2013.01)

(58) Field of Classification Search
CPC ........... H01L 23/5226; H01L 27/11565; H01L 27/11582; H01L 27/1157
See application file for complete search history.

(56) References Cited

U.S. PATENT DOCUMENTS

| 5,915,167 A | 6/1999 | Leedy |
| 9,230,974 B1 | 1/2016 | Pachamuthu et al. |
(Continued)

FOREIGN PATENT DOCUMENTS

WO WO 2014-130668 A1 8/2014

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Phuc T Dang
(74) *Attorney, Agent, or Firm* — The Marbury Law Group PLLC

(57) ABSTRACT

An alternating stack of insulating layers and sacrificial material layers is formed over a substrate. Memory openings are formed through the alternating stack. Annular recesses are formed by laterally recessing the sacrificial material layers around each memory opening. A tubular aluminum oxide spacer is formed at a periphery of each annular recess. A tubular silicon oxycarbide spacer is selectively deposited on each of the tubular aluminum oxide spacers. The tubular silicon oxycarbide spacers are converted into tubular silicon oxide spacers by an oxidation process. Tubular charge storage spacers are formed on inner sidewalls of the tubular silicon oxide spacers. A vertical semiconductor channel is formed over a respective vertical stack of tubular charge storage spacer within each memory opening. The sacrificial material layers are removed to form backside recesses. Electrically conductive material are deposited in the backside recesses to form electrically conductive layers.

11 Claims, 25 Drawing Sheets

(51) Int. Cl.
*H01L 27/11582* (2017.01)
*H01L 27/11565* (2017.01)
*H01L 27/1157* (2017.01)

(56) References Cited

U.S. PATENT DOCUMENTS

| | | | |
|---|---|---|---|
| 9,305,937 | B1 | 4/2016 | Tsutsumi et al. |
| 9,478,558 | B2 | 10/2016 | Koka et al. |
| 9,613,977 | B2 | 4/2017 | Sharangpani et al. |
| 9,659,955 | B1 | 5/2017 | Sharangpani et al. |
| 9,659,956 | B1 | 5/2017 | Pachamuthu et al. |
| 9,875,929 | B1 * | 1/2018 | Shukla .............. H01L 27/11582 |
| 9,991,277 | B1 | 6/2018 | Tsutsumi et al. |
| 10,283,513 | B1 | 5/2019 | Zhou et al. |
| 2003/0042527 | A1 | 3/2003 | Forbes et al. |
| 2003/0043632 | A1 | 3/2003 | Forbes |
| 2003/0043633 | A1 | 3/2003 | Forbes et al. |
| 2003/0045082 | A1 | 3/2003 | Eldridge et al. |
| 2003/0048666 | A1 | 3/2003 | Eldridge et al. |
| 2004/0159863 | A1 | 8/2004 | Eldridge et al. |
| 2005/0023595 | A1 | 2/2005 | Forbes et al. |
| 2005/0023602 | A1 | 2/2005 | Forbes et al. |
| 2005/0023603 | A1 | 2/2005 | Eldridge et al. |
| 2005/0024945 | A1 | 2/2005 | Forbes |
| 2006/0199338 | A1 | 9/2006 | Eldridge et al. |
| 2006/0231886 | A1 | 10/2006 | Forbes et al. |
| 2006/0234450 | A1 | 10/2006 | Forbes et al. |
| 2006/0237768 | A1 | 10/2006 | Forbes et al. |
| 2007/0138534 | A1 | 6/2007 | Eldridge et al. |
| 2007/0145462 | A1 | 6/2007 | Eldridge et al. |
| 2007/0178635 | A1 | 8/2007 | Eldridge et al. |
| 2010/0178755 | A1 | 7/2010 | Lee et al. |
| 2011/0129984 | A1 | 6/2011 | Funayama et al. |
| 2012/0108048 | A1 | 5/2012 | Lim et al. |
| 2012/0129317 | A1 | 5/2012 | Funayama et al. |
| 2016/0005746 | A1 | 1/2016 | Lee |
| 2016/0111439 | A1 | 4/2016 | Tsutsumi et al. |
| 2016/0211272 | A1 | 7/2016 | Koka et al. |
| 2016/0379989 | A1 | 12/2016 | Sharangpani et al. |
| 2017/0062330 | A1 | 3/2017 | Kim et al. |
| 2017/0125436 | A1 | 5/2017 | Sharangpani et al. |
| 2017/0155045 | A1 | 6/2017 | Orlowski et al. |
| 2017/0162595 | A1 * | 6/2017 | Kitahara .......... H01L 21/32139 |
| 2018/0090373 | A1 | 3/2018 | Sharangpani et al. |
| 2018/0151588 | A1 * | 5/2018 | Tsutsumi ............ H01L 29/0847 |
| 2018/0204849 | A1 * | 7/2018 | Carlson ............... H01L 27/1157 |
| 2018/0261623 | A1 | 9/2018 | Higashi et al. |
| 2018/0374866 | A1 | 12/2018 | Makala et al. |
| 2019/0020343 | A1 | 1/2019 | Lee et al. |
| 2019/0139973 | A1 | 5/2019 | Zhou et al. |

OTHER PUBLICATIONS

Sasaoka, C. et al., "Aluminum Selective Area Deposition on Si Using Diethylaluminumchloride," Appl. Phys. Lett., vol. 55, pp. 741-743, (1989); https.//doi.org/10.1063/1.101792.

Tsubouchi, K. et al., "Selective Aluminum Chemical Vapor Deposition," Journal of Vacuum Science & Technology A, vol. 10, 856 (1992); doi: 10.1116/1.577684.

Gladfelter, W.L., "Selective Metallization by Chemical Vapor Deposition," Chem. Mater., vol. 5, pp. 1372-1388, (1993).

U.S. Appl. No. 16/009,661, filed Jun. 15, 2018, SanDisk Technologies LLC.

U.S. Appl. No. 16/136,652, filed Sep. 20, 2018, SanDisk Technologies LLC.

U.S. Appl. No. 16/242,245, filed Jan. 8, 2019, SanDisk Technologies LLC.

U.S. Appl. No. 16/272,468, filed Feb. 11, 2019, SanDisk Technologies LLC.

* cited by examiner

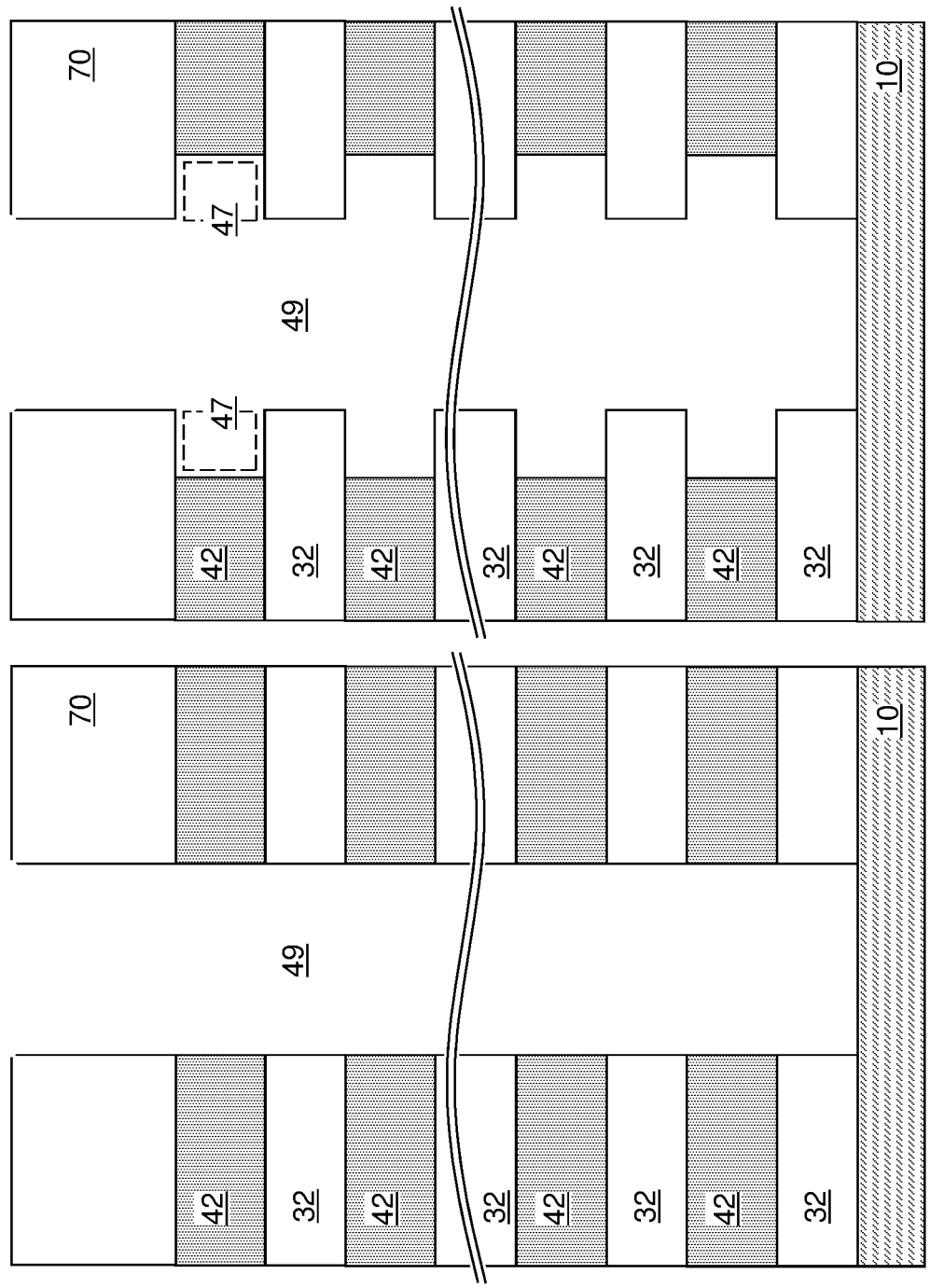

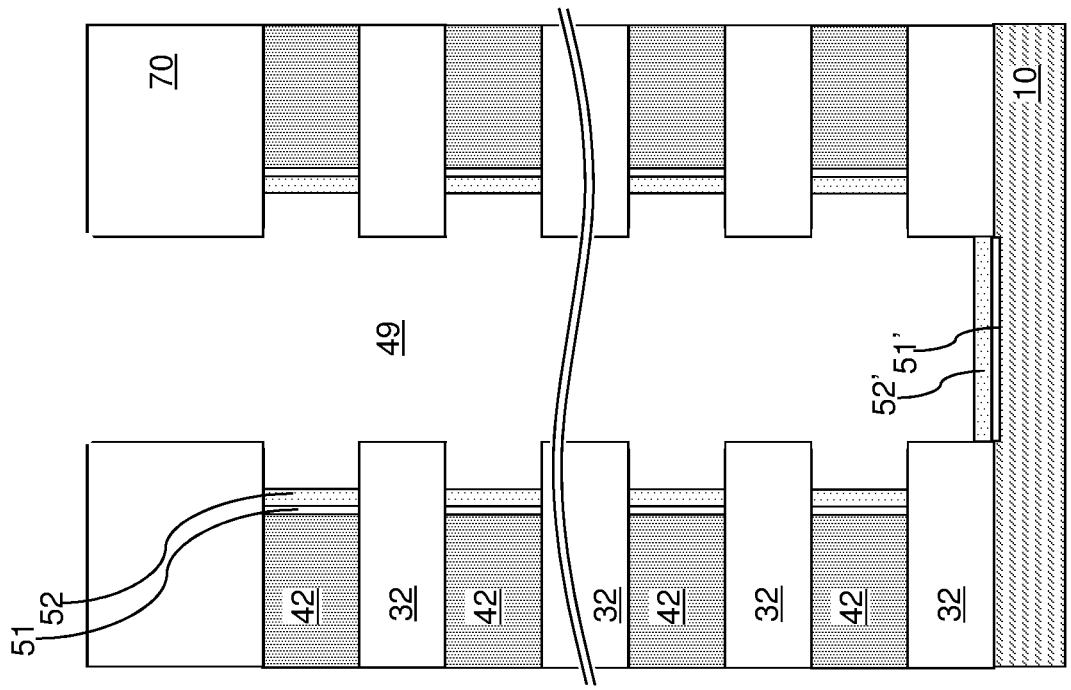
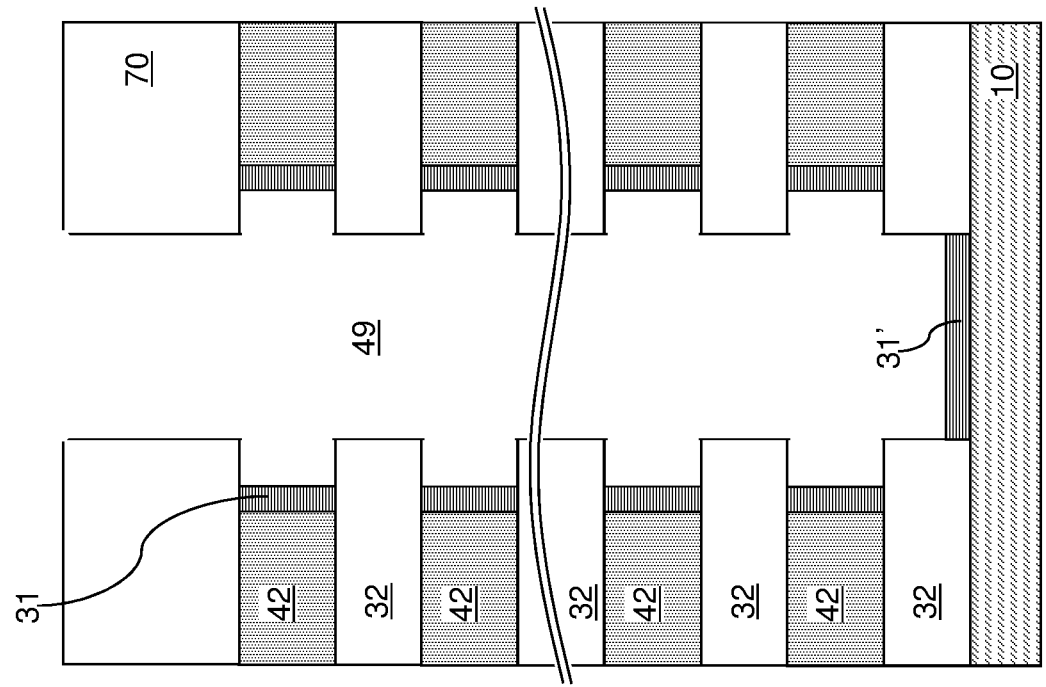

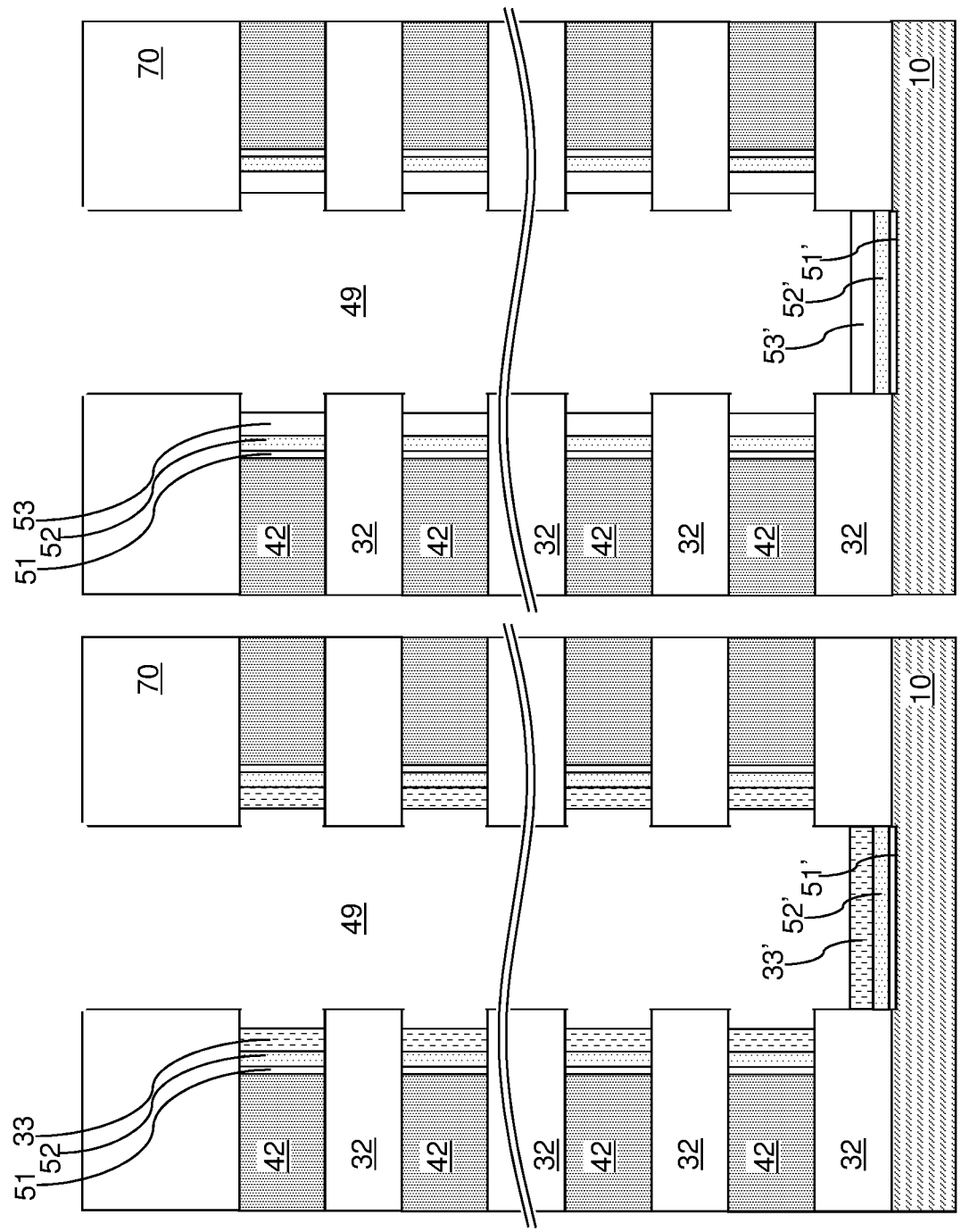

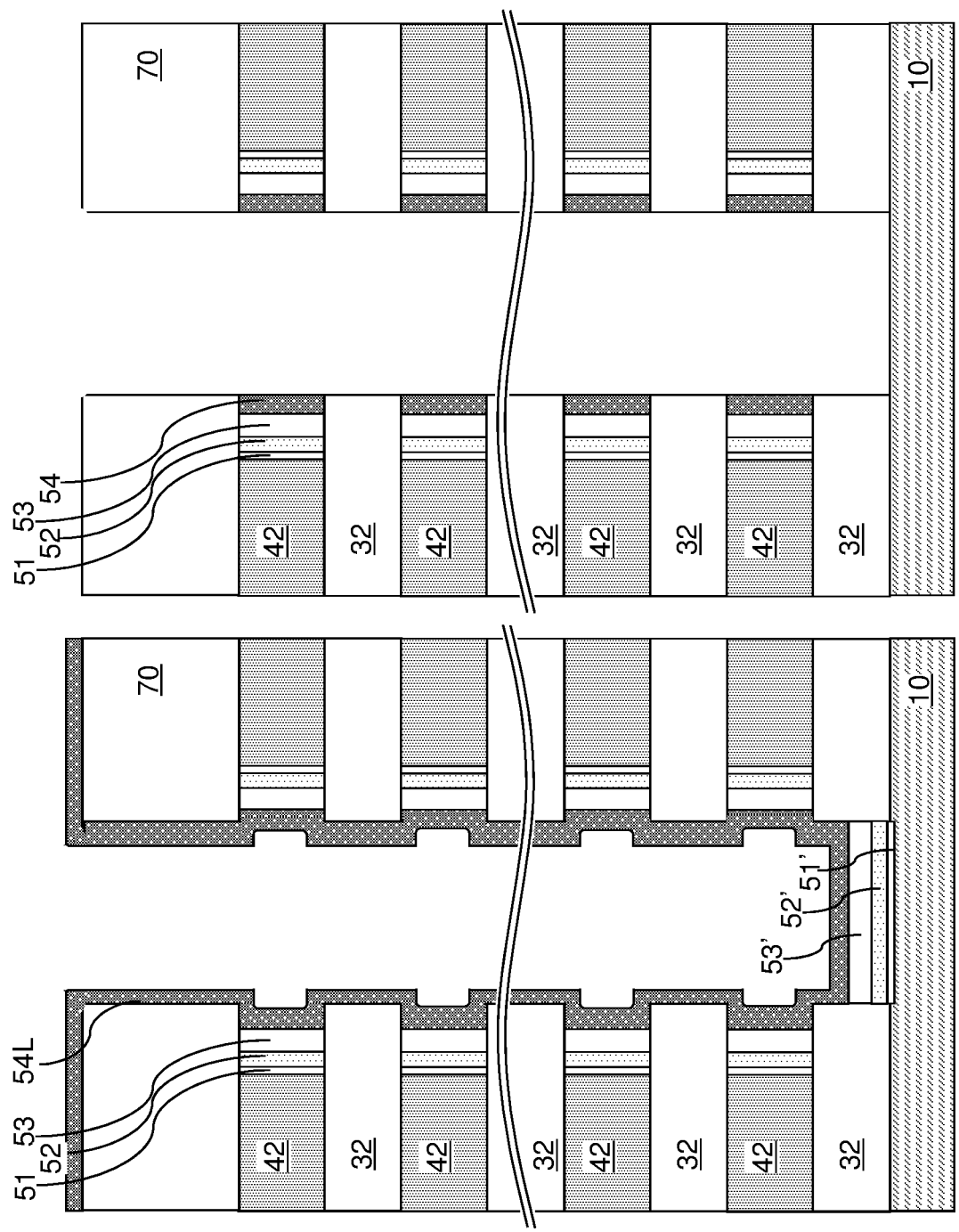

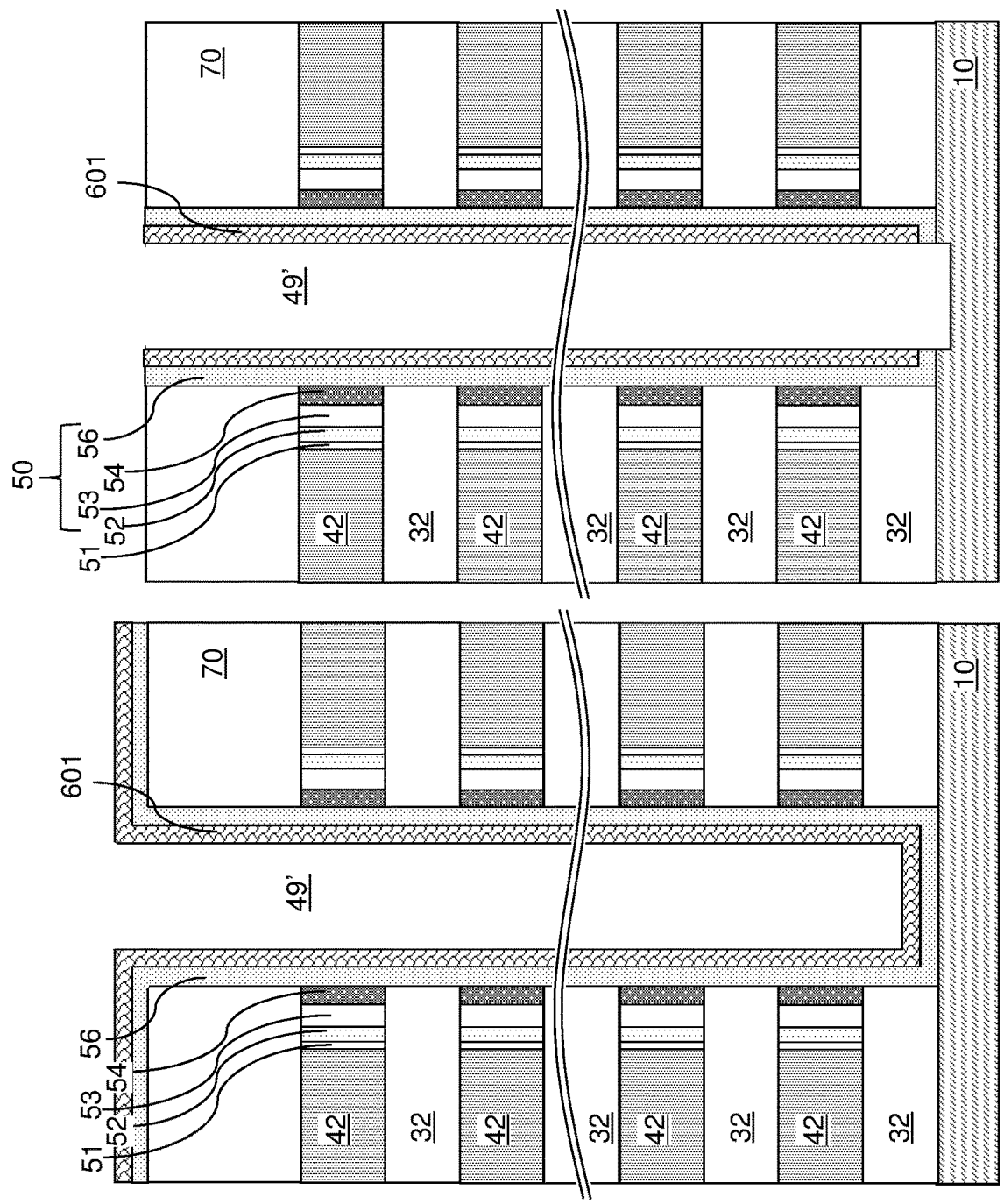

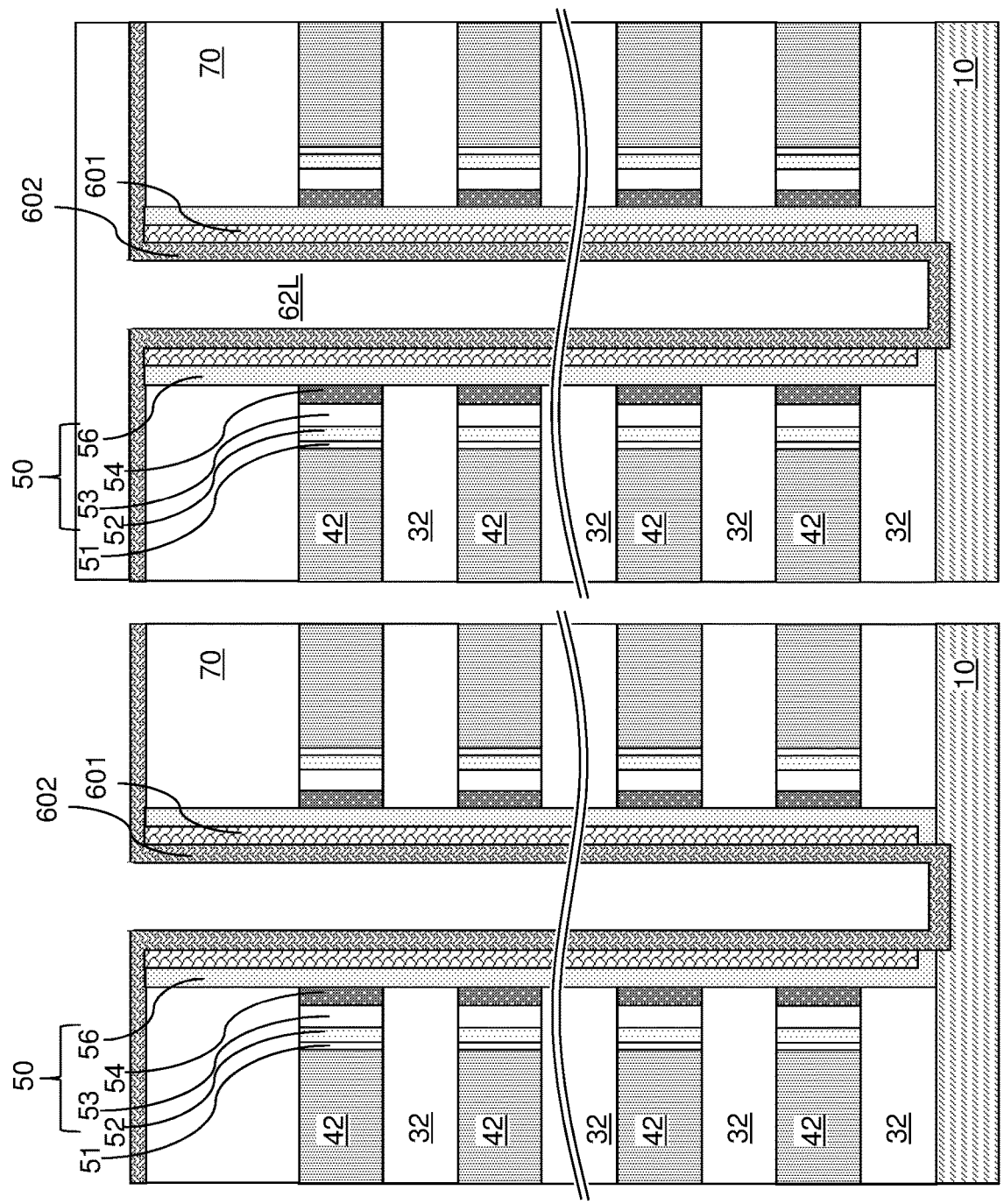

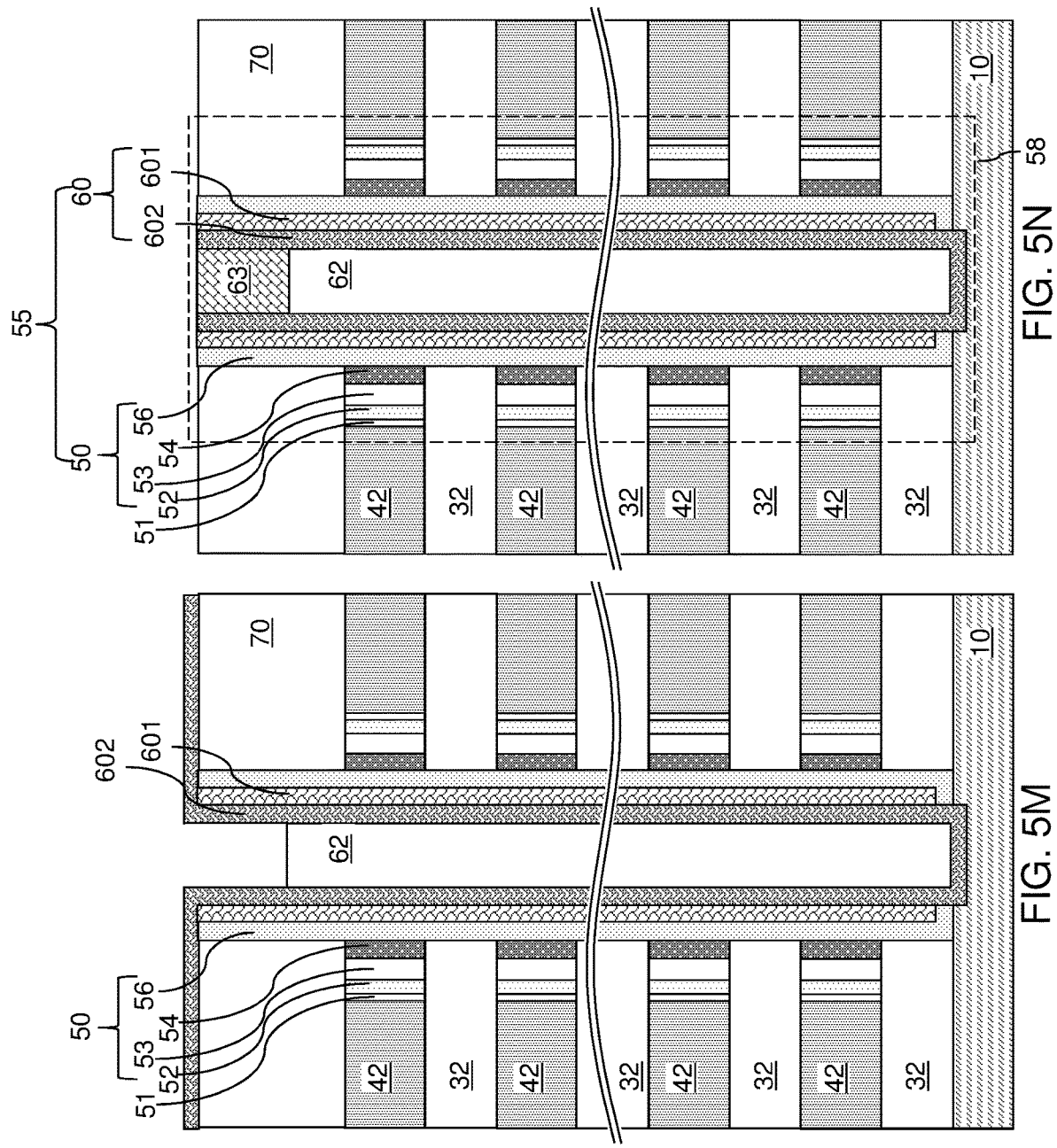

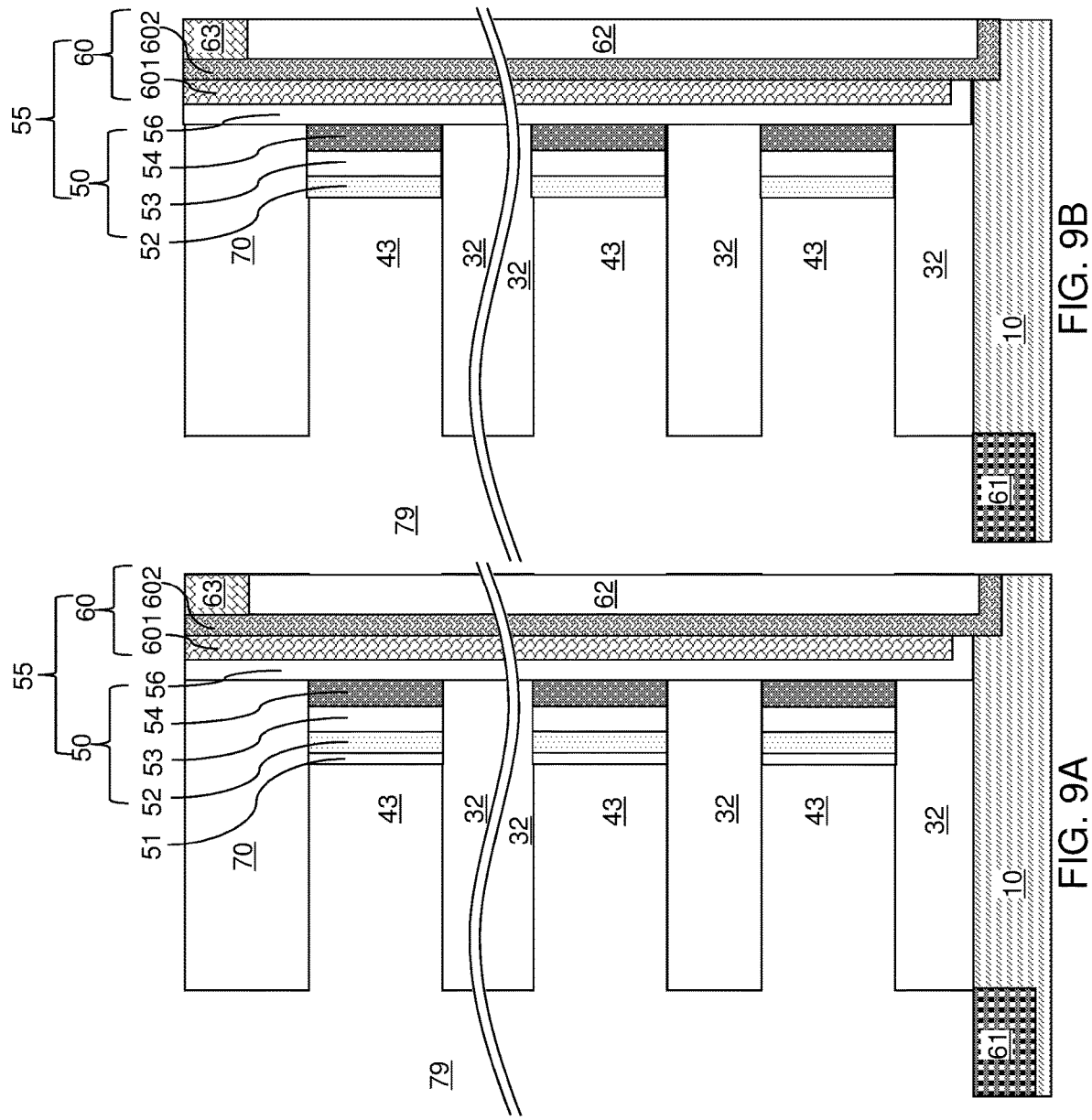

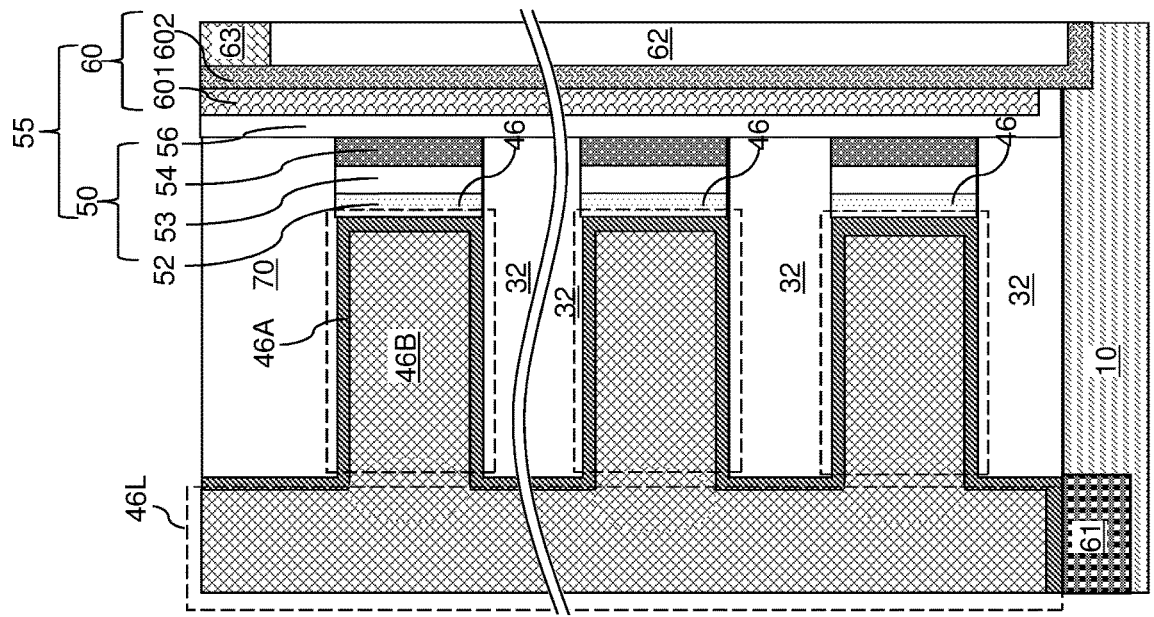
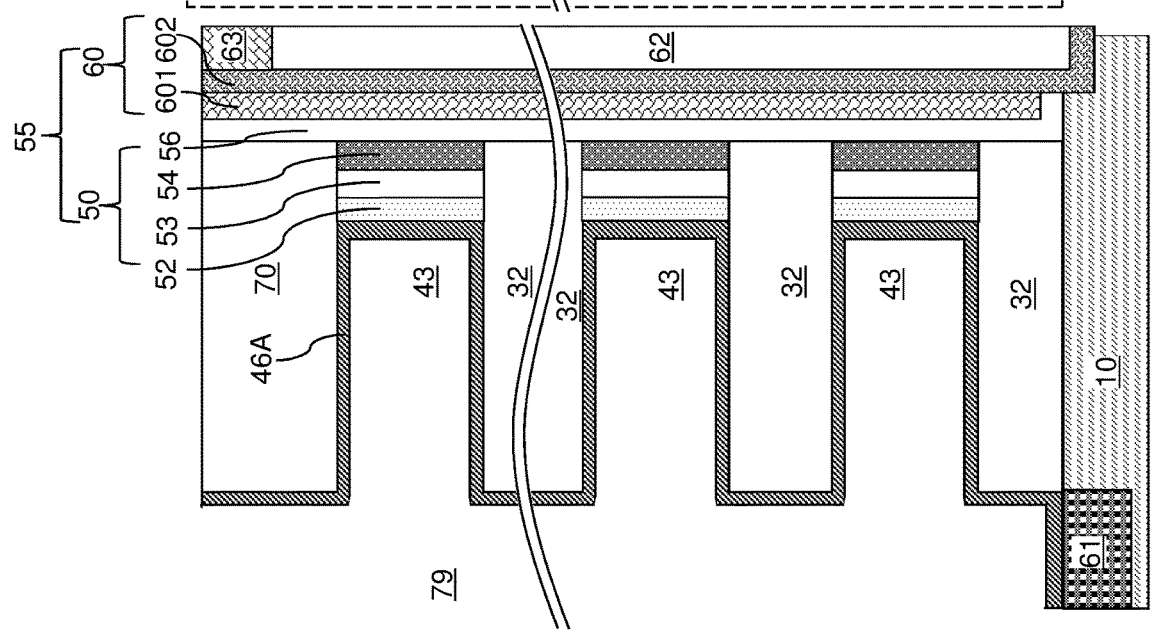

US 11,049,807 B2

THREE-DIMENSIONAL MEMORY DEVICE CONTAINING TUBULAR BLOCKING DIELECTRIC SPACERS

FIELD

The present disclosure relates generally to the field of semiconductor devices, and particularly to a three-dimensional memory device containing tubular blocking dielectric spacers and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device is provided, which comprises: an alternating stack of insulating layers and electrically conductive layers located over a substrate; and a memory stack structure extending through the alternating stack and comprising a vertical semiconductor channel, a tunneling dielectric layer extending through multiple electrically conductive layers within the alternating stack, and a vertical stack of discrete, vertically separated nested tubular structures, wherein each nested tubular structure comprises: a tubular charge storage spacer contacting a portion of an outer sidewall of the tunneling dielectric layer; a tubular silicon oxide spacer contacting the tubular charge storage spacer; and a tubular aluminum oxide spacer contacting the tubular silicon oxide spacer.

According to another aspect of the present disclosure, a method of forming a three-dimensional memory device is provided, which comprises the steps of: forming an alternating stack of insulating layers and sacrificial material layers over a substrate; forming memory openings through the alternating stack; forming annular recesses by laterally recessing the sacrificial material layers around each memory opening; forming a tubular aluminum oxide spacer at a periphery of each annular recess; selectively depositing a tubular silicon oxycarbide spacer on an inner sidewall of each of the tubular aluminum oxide spacers; converting the tubular silicon oxycarbide spacers into tubular silicon oxide spacers by an oxidation process; forming tubular charge storage spacer on inner sidewalls of the tubular silicon oxide spacers; forming a vertical semiconductor channel over a respective vertical stack of tubular charge storage spacers within each memory opening; and replacing the sacrificial material layers with electrically conductive layers.

BRIEF DESCRIPTION OF THE DRAWINGS

FIGS. 5A-5N are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

DETAILED DESCRIPTION

Figure 1:
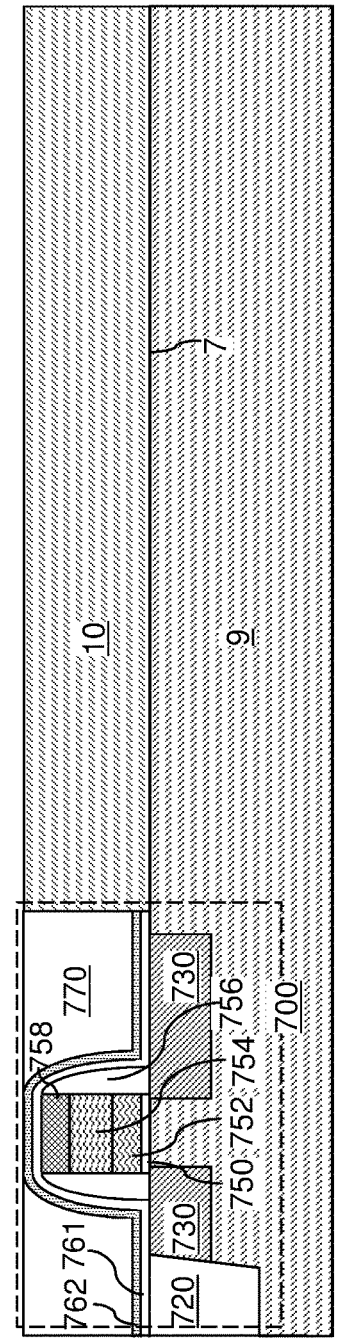
FIG. 1 is a schematic vertical cross-sectional view of an exemplary structure after formation of at least one peripheral device and a semiconductor material layer according to an embodiment of the present disclosure.

As discussed above, the embodiments of the present disclosure are directed to a three-dimensional memory device containing tubular blocking dielectric spacers and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m.

As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may optionally be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

In an alternative embodiment, the peripheral device region 200 containing the at least one semiconductor device 700 is not formed on the same substrate (9, 10) as the memory array region 100. Instead, the peripheral device region 200 containing the at least one semiconductor device 700 is formed on a separate substrate and is then bonded to the substrate (9, 10) containing the memory array region 100.

Figure 2:
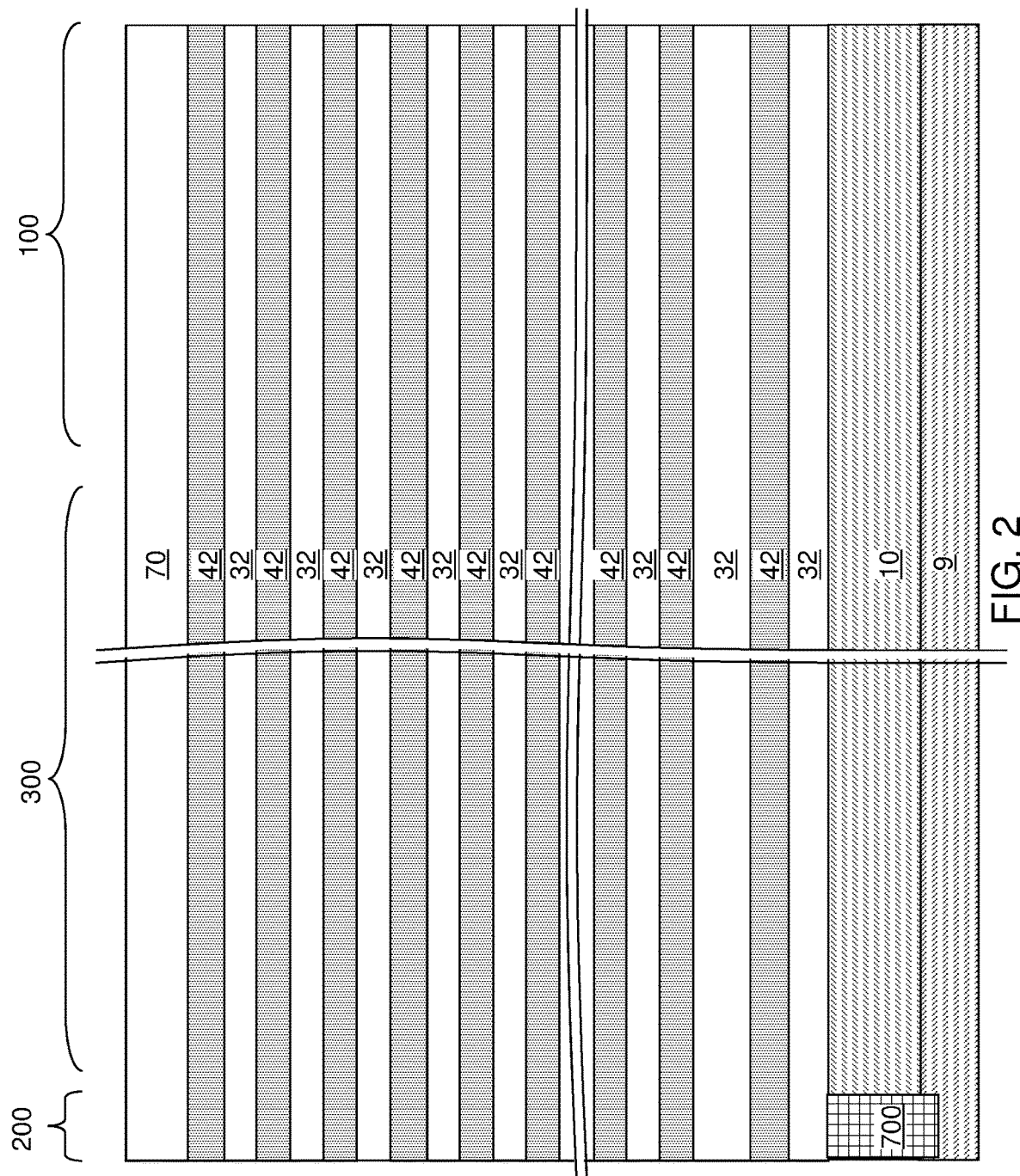
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include an amorphous semiconductor material (such as amorphous silicon) and a polycrystalline semiconductor material (such as polysilicon). In one embodiment, the sacrificial material layers 42 can be spacer material layers that comprise a semiconductor material including at least one of silicon and germanium.

In one embodiment, the insulating layers 32 can include silicon oxide, and sacrificial material layers can include polysilicon layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
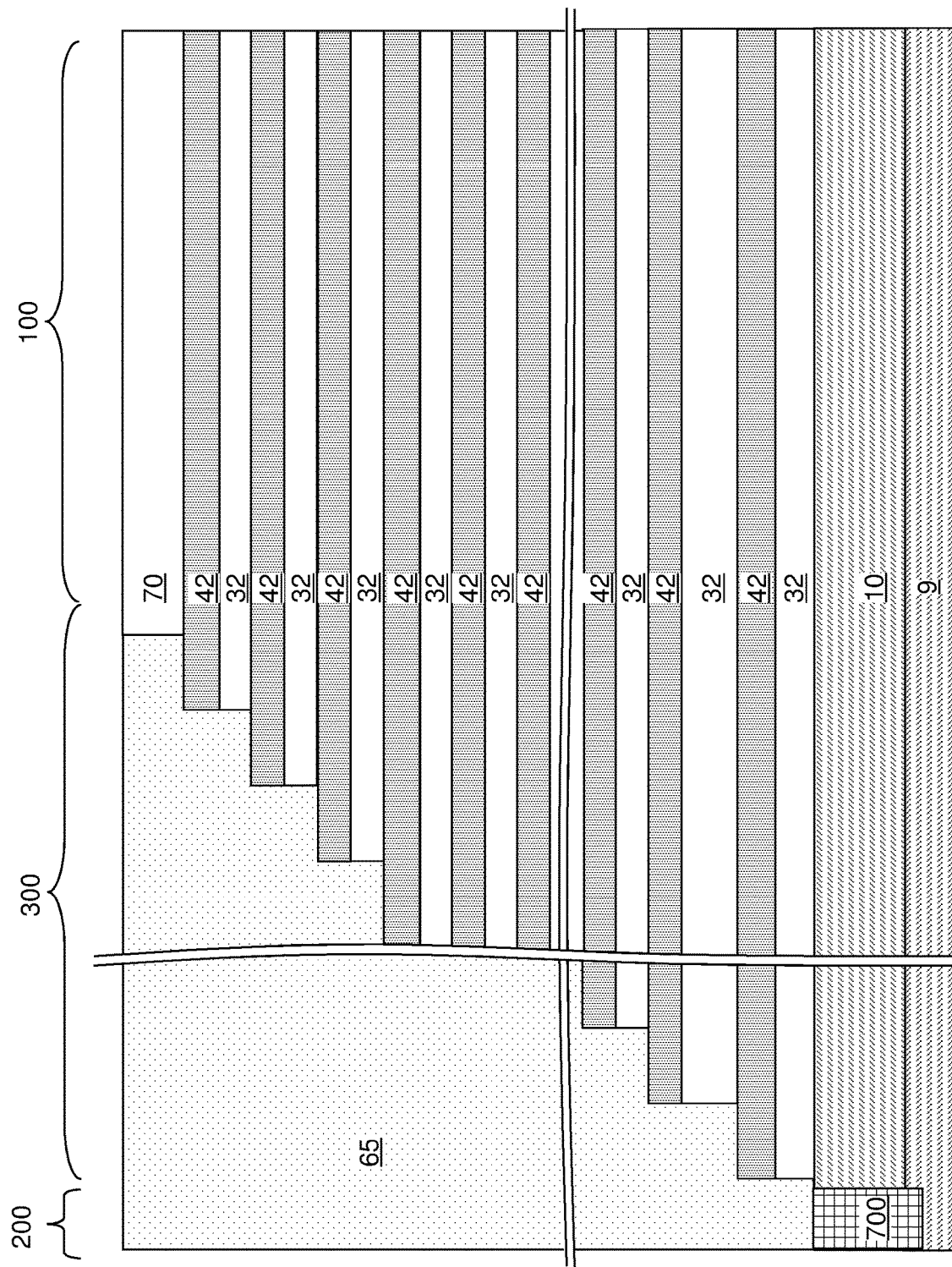
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
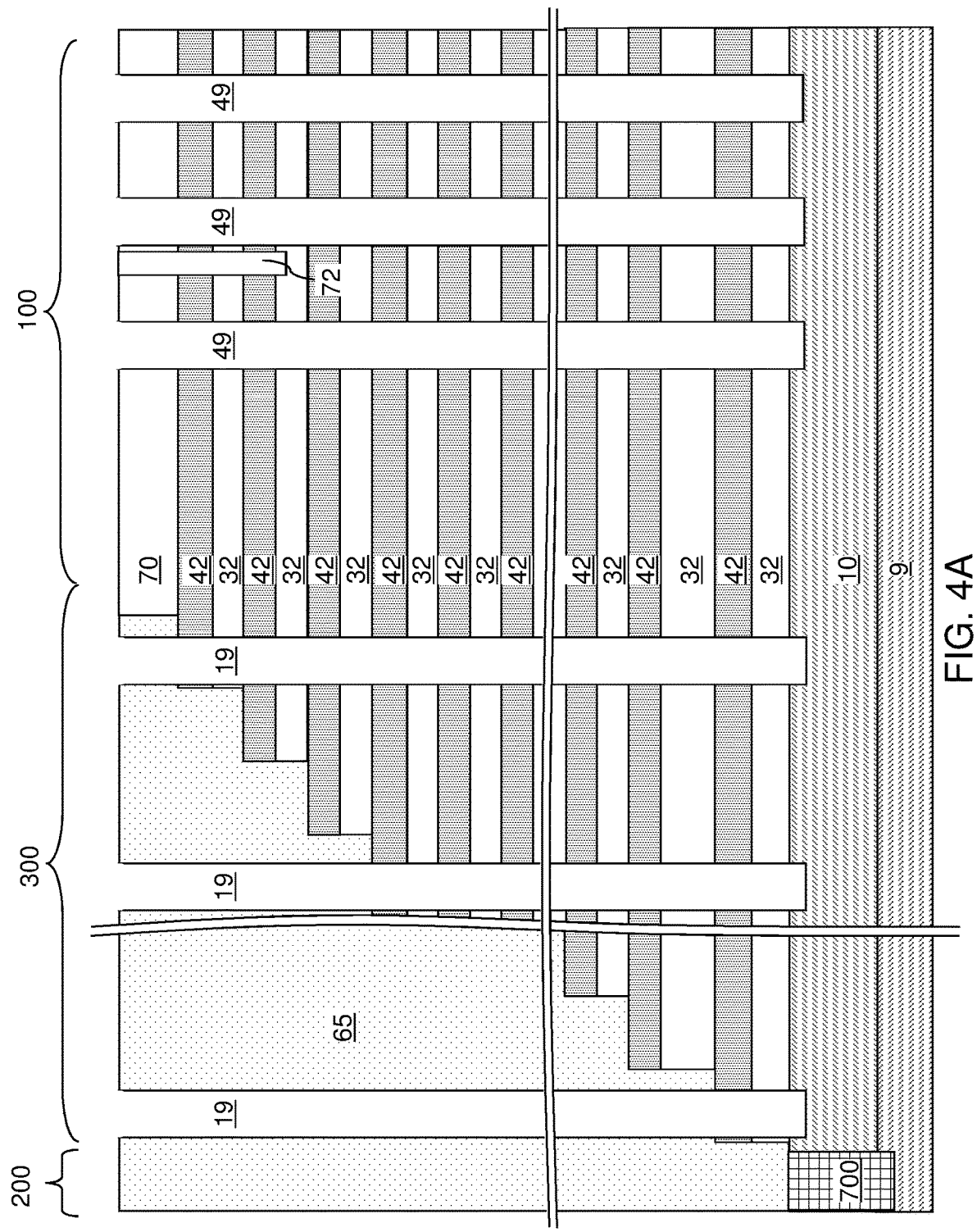
FIG. 4A is a schematic vertical cross-sectional view of the exemplary structure after formation of memory openings and support openings according to an embodiment of the present disclosure.
Figure 4B:
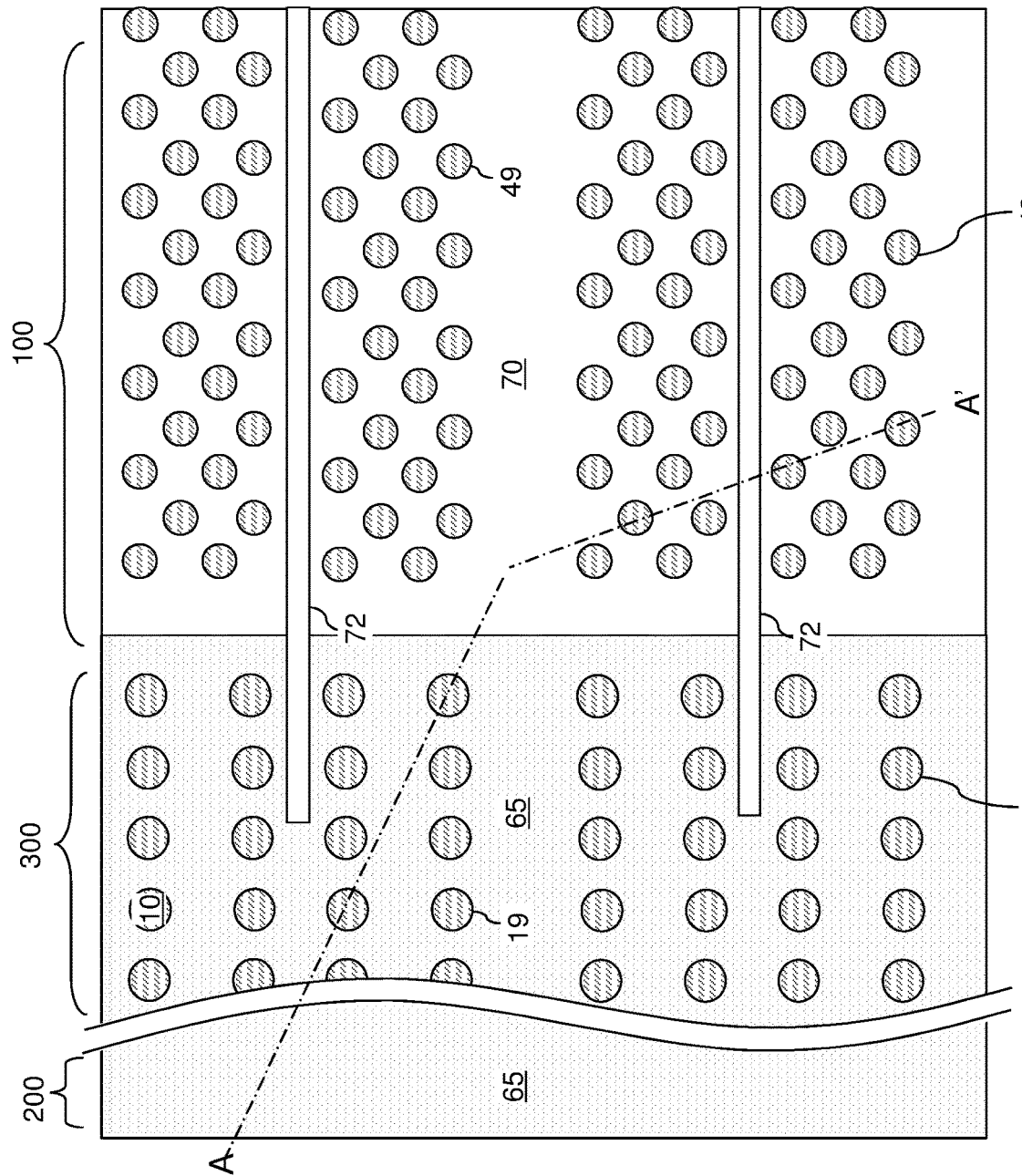
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5N illustrate structural changes in a memory opening 49, which is one of the memory openings 49 in the exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed.

Referring to FIG. 5B, the sacrificial material layers 42 can be laterally recessed to form annular recesses 47. For example, if the sacrificial material layers 42 consist of a semiconductor material such as amorphous silicon, polysilicon, or a silicon-germanium alloy, a wet etch process using hot trimethyl-2 hydroxyethyl ammonium hydroxide ("hot TMY") can be employed to laterally recess the sidewalls of the sacrificial material layers 42 relative to the insulating layers 32. The lateral recess distance by which sidewalls of the sacrificial material layers 42 are laterally recessed can be in a range from 5 nm to 100 nm, such as from 10 nm to 50 nm, although lesser and greater lateral recess distances can also be employed.

Referring to FIG. 5C, aluminum can be selectively deposited on the physically exposed portions of the semiconductor surfaces without growth of aluminum from physically exposed surfaces of the insulating layers 32 and the insulating cap layer 70. Selective deposition of aluminum can be effected by a chemical vapor deposition process employing trimethylaluminum [TMA: $Al(CH_3)_3$], dimethylaluminum hydride [DMAH: $Al(CH_3)_2H$], or diethylaluminum chloride [DEACl: $Al(C_2H_5)_2Cl$] optionally with additional hydrogen gas. Tubular aluminum spacers 31 can be formed on each tubular sidewall of the sacrificial material layers 42 around each annular recess 47. An aluminum plate 31' can be collaterally formed on each physically exposed surface of the semiconductor material layer 10 at the bottom of each memory opening 49. The thickness of each tubular aluminum spacer 31 (as measured between an inner sidewall and an outer sidewall) can be in a range from 2 nm to 15 nm, such as 2 nm to 5 nm, although lesser and greater thicknesses can also be employed.

Referring to FIG. 5D, a first oxidation process can be performed to covert the tubular aluminum spacers 31 into tubular aluminum oxide spacers 52. The first oxidation process can convert interfacial portions of the semiconductor material of the sacrificial material layers 42 that is in proximity to the tubular aluminum spacers 31 into tubular semiconductor oxide spacers, which are herein referred to as tubular semiconductor oxide spacers 51. In other words, a surface portion of each spacer material layer 42 that adjoins a respective tubular aluminum spacer 31 can be converted into a tubular semiconductor oxide spacer 51 (such as a silicon oxide spacer) due to oxygen atoms that diffuse through the tubular aluminum spacers 31. Each aluminum plate 31' can be converted into an aluminum oxide plate 52' during the first oxidation process. Each surface portion of the semiconductor material layer 10 that underlies an aluminum plate 31' can be converted into a semiconductor oxide plate 51', such as a silicon oxide plate.

A tubular aluminum oxide spacer 52 can be formed at a periphery of each annular recess 47. Each tubular aluminum oxide spacer 52 and each aluminum oxide plate 52' can have a thickness in a range from 2 nm to 20 nm, such as from 2.5 nm to 7.5 nm, although lesser and greater thicknesses can also be employed. Each tubular semiconductor oxide spacer 51 and each semiconductor oxide plate 51' can have a thickness in a range from 1 nm to 10 nm, such as from 1.5 nm to 5 nm, although lesser and greater thicknesses can also be employed. Each of the tubular aluminum oxide spacers 52 has a respective annular top surface that contacts a respective overlying one of the insulating layers 32 and has an annular bottom surface that contacts a respective underlying one of the insulating layers 32. In an alternative embodiment, the tubular semiconductor oxide spacers 51 and the semiconductor oxide plate 51' may be omitted if the oxidation of the aluminum spacers 31 terminates before oxygen atoms reach the semiconductor sacrificial material layers 42.

Referring to FIG. 5E, a silicon oxycarbide spacer 33 can be selectively deposited on the physically exposed inner sidewall of each tubular aluminum oxide spacers 52 without growth of silicon oxycarbide from physically exposed surfaces of the insulating layers 32 and the insulating cap layer 70. The silicon oxycarbide spacers 33 can be formed by selective deposition of silicon oxycarbide by chemical vapor deposition. A silicon oxycarbide plate 33' can be formed on a top surface of each aluminum oxide plate 52'. For example, a first precursor comprising $SiX_4$ or $Si_2X_6$, in which X is a halide element, and a second precursor comprising a compound including at least one carbon atom and at least two hydroxyl groups can be employed during the chemical vapor deposition process to selectively deposit silicon oxycarbide on aluminum oxide surfaces without inducing deposition of silicon oxycarbide on silicon oxide surfaces. In one embodiment, each X can be independently selected from Cl, Br and I. For example, the first precursor can have a formula of $(X_yH_{3-y}Si)_zCH_{4-z}$, and may include a material such as bis (trichlorosilyl)methane, hexachlorodisilylmethylene, 1,1'-methylenebis(1,1,1-trichlorosilane), or methylenebis (trichlorosilane). Alternately, the first precursor can have a formula of $(X_yH_{3-y}Si)(CH_2)_n(SiX_yH_{3-y})$. In one embodiment, the second precursor comprises a diol. In one embodiment, the second precursor can include, for example, ethylene glycol, propylene glycol and/or butane-1,4-diol. In one embodiment, the diol comprises ethylene glycol. Additional combinations of precursor gases that may be employed to selectively deposit silicon oxycarbide are disclosed, for example, in PCT published application having WIPO Publication No. WO14/130668A1. A tubular silicon oxycarbide spacer 33 can be selectively deposited on an inner sidewall of each of the tubular aluminum oxide spacers 52. The silicon oxycarbide spacers 33 can consist essentially of silicon atoms, carbon atoms, and oxygen atoms. The atomic percentage of carbon atoms in the silicon oxycarbide spacers 33 can be in a range from 15% to 35%. The lateral thickness (i.e., the distance between an inner sidewall and an outer sidewall) of each tubular silicon oxycarbide spacer 33 can be in a range from 5 nm to 30 nm, although lesser and greater thicknesses can also be employed.

Referring to FIG. 5F, a second oxidation process can be performed, in which carbon atoms in the tubular silicon oxycarbide spacers 33 are removed. The tubular silicon oxycarbide spacers 33 can be converted into tubular silicon oxide spacers 53 by the second oxidation process. Each silicon oxycarbide plate 33' can be converted into a silicon oxide plate 53'. In one embodiment, the second oxidation process comprises a wet oxidation process employing water vapor as an oxidizing ambient. The water vapor can be generated in-situ or ex-situ by a water vapor generator (WVG). The temperature of the anneal can be in a range from 600 degrees Celsius to 1,000 degrees Celsius, although lesser and greater temperatures can also be employed. The partial pressure of the water vapor during the anneal process can be in a range from 1 mTorr to 1 atm, and/or may be in a range from 10 mTorr to 100 Torr, although lesser and greater partial pressures can also be employed. In this case, the carbon atoms can combine with oxygen atoms from the water vapor ambient, and can be removed as carbon monoxide or carbon dioxide gas. Each of the tubular silicon oxide spacers 53 has a respective annular top surface that contacts a respective overlying one of the insulating layers 32 and has an annular bottom surface that contacts a respective underlying one of the insulating layers 32. Each tubular silicon oxide spacer 53 can have a lateral thickness in a range from 5 nm to 30 nm between an inner sidewall and an outer sidewall thereof, although lesser and greater thicknesses can also be employed.

Referring to FIG. 5G, a charge storage material layer 54L can be conformally deposited on the inner sidewalls of the tubular silicon oxide spacers 53 and sidewalls of the insulating layers 32 around the memory openings 49 and around the support openings 19. The charge storage material layer 54L includes a charge storage material such as silicon nitride, a semiconductor material (such as polysilicon), or a metallic material (such as a metal or a metal silicide). The charge storage material layer 54L can have a thickness in a range from 5 nm to 30 nm, such as from 8 nm to 16 nm, although lesser and greater thicknesses can also be employed.

Referring to FIG. 5H, the charge storage material layer 54L can be anisotropically etched. Portions of the charge storage material layer 54L that are located outside the annular recesses 47 can be removed during the anisotropic etch process. Further, the anisotropic etch process can remove the silicon oxide plate 53', the aluminum oxide plate 52', and the semiconductor oxide plate 51' at the bottom of each memory opening 49 and at the bottom of each support opening 19. Each remaining tubular portion of the charge storage material layer 54L constitutes a tubular charge storage spacer 54. The tubular charge storage spacers 54 are formed on inner sidewalls of the tubular silicon oxide spacers 53.

In one embodiment, each of the tubular charge storage spacers 54 has a respective annular top surface that contacts a respective overlying one of the insulating layers 32 and has a respective annular bottom surface that contacts a respective underlying one of the insulating layers 32. A discrete, nested tubular structure (51, 52, 53, 54) including a tubular charge storage spacer 54, a tubular silicon oxide spacer 53 that laterally surrounds the tubular charge storage layer 54, a tubular aluminum oxide spacer 52 that laterally surrounds the tubular silicon oxide spacer 53, and a tubular semiconductor oxide spacer 51 that laterally surrounds the tubular aluminum oxide spacer 52 can be formed in each annular recess 47. In one embodiment, each of the tubular charge storage spacer 54, the tubular silicon oxide spacer 53, the tubular aluminum oxide spacer 52, and the tubular semiconductor oxide spacer 51 within each nested tubular structure (51, 52, 53, 54) has a respective uniform lateral thickness throughout. The lateral thickness is defined as a lateral distance between an inner sidewall and an outer sidewall for each of the tubular spacers (51, 52, 53, 54). In one embodiment, the tubular charge storage spacer 54, the tubular silicon oxide spacer 53, the tubular aluminum oxide spacer 52, and the tubular semiconductor oxide spacer 51 within each nested tubular structure (51, 52, 53, 54) can have a uniform (i.e., identical) height throughout, which can be the same as the height of a sacrificial material layer 42 located at the same level. In one embodiment, the inner sidewalls of the tubular charge storage spacers 54 around each memory opening 49 can be vertically coincident with sidewalls of the insulating layers 32 around the respective memory opening 49. In one embodiment, each tubular charge storage spacer 54 in the nested tubular structures (51, 52, 53, 54) consists essentially of silicon nitride.

Referring to FIG. 5I, a tunneling dielectric layer 56 can be deposited inside each vertical stack of nested tubular structure (51, 52, 53, 54), i.e., inside each memory opening 49 and inside each support opening 19. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

An optional first semiconductor channel layer 601 can be deposited on the tunneling dielectric layer 56. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (56, 601).

In one embodiment, an outer sidewall of the tunneling dielectric layer 56 vertically extends straight from a topmost one of the sacrificial material layers 42 to a bottommost one of the sacrificial material layers 42. Each inner sidewall of the tubular charge storage spacers 54 in the nested tubular structures (51, 52, 53, 54) can be in direct contact with the outer sidewall of a respective tunneling dielectric layer 56. Each nested tubular structure (51, 52, 53, 54) comprises: a tubular charge storage spacer 54 contacting a portion of an outer sidewall of a tunneling dielectric layer 56, a tubular silicon oxide spacer 53 contacting the tubular charge storage spacer 54, and a tubular aluminum oxide spacer 52 contacting the tubular silicon oxide spacer 53.

Referring to FIG. 5J, the optional first semiconductor channel layer 601 and the tunneling dielectric layer 56 are sequentially anisotropically etched employing at least one anisotropic etch process. The portions of the first semiconductor channel layer 601 and the tunneling dielectric layer 56 located above the top surface of the insulating cap layer 70 can be removed by the at least one anisotropic etch process. Further, the horizontal portions of the first semiconductor channel layer 601 and the tunneling dielectric layer 56 at a bottom of each memory cavity 49' can be removed to form openings in remaining portions thereof. Each of the first semiconductor channel layer 601 and the tunneling dielectric layer 56 can be etched by a respective anisotropic etch process employing a respective etch chemistry, which may, or may not, be the same for the various material layers.

Each remaining portion of the first semiconductor channel layer 601 can have a respective tubular configuration. Each remaining portion of the tunneling dielectric layer 56 can have a respective tubular configuration. Each contiguous set of tubular aluminum oxide spacers 52, tubular silicon oxide spacers 53, tubular charge storage spacers 54, and a tunneling dielectric layer 56 constitutes a memory film 50, which includes a vertical stack of charge storage elements comprising tubular charge storage spacers 54.

Referring to FIG. 5K, a second semiconductor channel layer 602 can be deposited directly on the semiconductor material layer 10 and directly on the optional first semiconductor channel layer 601 (or on the tunneling dielectric 56 of the first semiconductor channel is omitted). The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5M, the horizontal portion of the dielectric core layer 62L can be removed, for example, by a recess etch from above the top surface of the insulating cap layer 70. The material of the dielectric core layer 62L can be further recessed such that each remaining portion of the dielectric core layer 62L has a top surface between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 5N, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The atomic concentration of the dopants of the second conductivity type in the deposited doped semiconductor material can be in a range from $5.0 \times 10^{19}/\text{cm}^3$ to $2.0 \times 10^{21}/\text{cm}^3$, although lesser and greater dopant concentrations can also be employed. The doped semiconductor material can be, for example, doped polysilicon.

Excess portions of the deposited semiconductor material of the second conductivity type and horizontal portion of the second semiconductor channel layer 602 located above the top surface of the insulating cap layer 70 can be removed from above the top surface of the insulating cap layer 70, for example, by chemical mechanical planarization (CMP) or a recess etch. Each remaining portion of the doped semiconductor material of the second conductivity type constitutes a drain region 63. Each remaining portion of the second semiconductor channel layer 602 can be located entirely within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. Each contiguous combination of a memory film 50 and a vertical semiconductor channel 60 constitutes a memory stack structure 55. The memory elements within the memory film 50, i.e., the tubular charge storage spacers 54, are configured to store electrical charges for a macroscopic retention time to provide a non-volatile memory device. As used herein, a macroscopic retention time refers to a retention time suitable for operation of a memory device as a permanent memory device such as a retention time in excess of 24 hours.

Each contiguous set of tubular semiconductor oxide spacers 51, a memory film 50, a vertical semiconductor channel 60, a dielectric core 62, and a drain region 63 within a memory opening 49 is herein referred to as a memory opening fill structure 58. Each contiguous set of tubular semiconductor oxide spacers 51, a memory film 50, a vertical semiconductor channel 60, a dielectric core 62, and a drain region 63 within a support opening 19 fills the respective support openings 19, and constitutes a support pillar structure.

Figure 6:
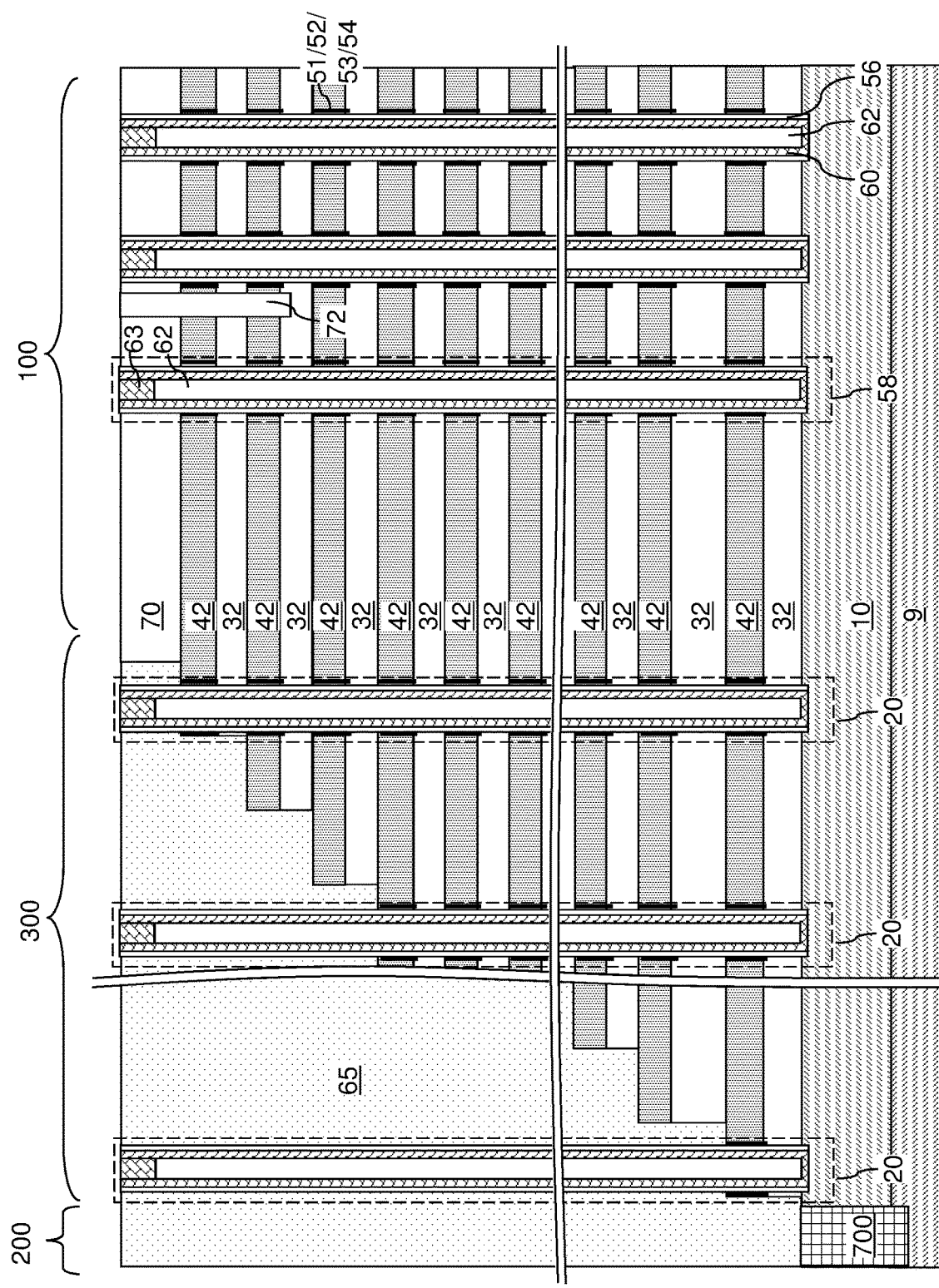
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of discrete, vertically separated charge storage regions comprising tubular charge storage spacers 54, and discrete, vertically separated blocking dielectric segments comprising tubular oxide spacers 53 and tubular aluminum oxide spacers 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
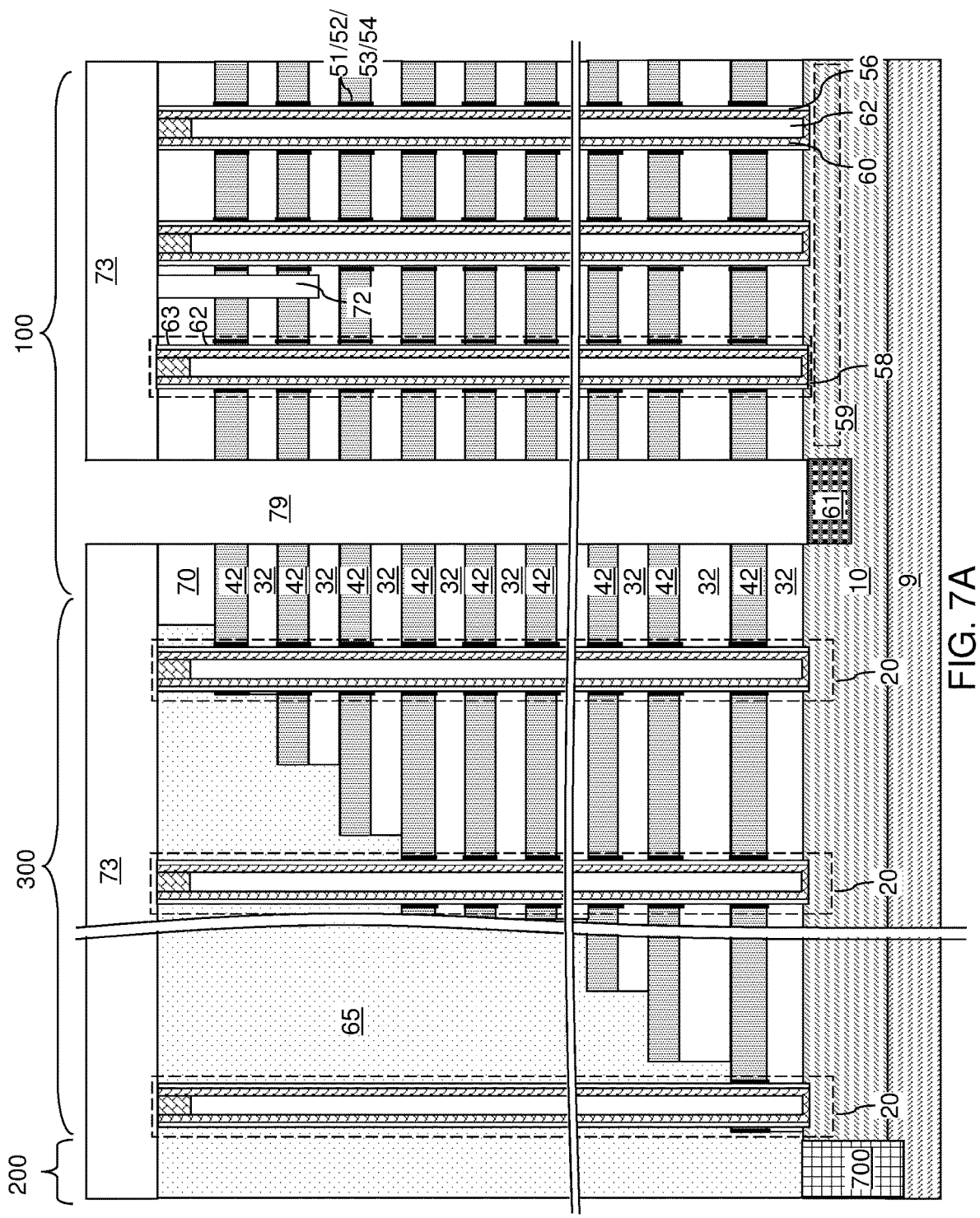
FIG. 7A is a schematic vertical cross-sectional view of the exemplary structure after formation of backside trenches according to an embodiment of the present disclosure.
Figure 7B:
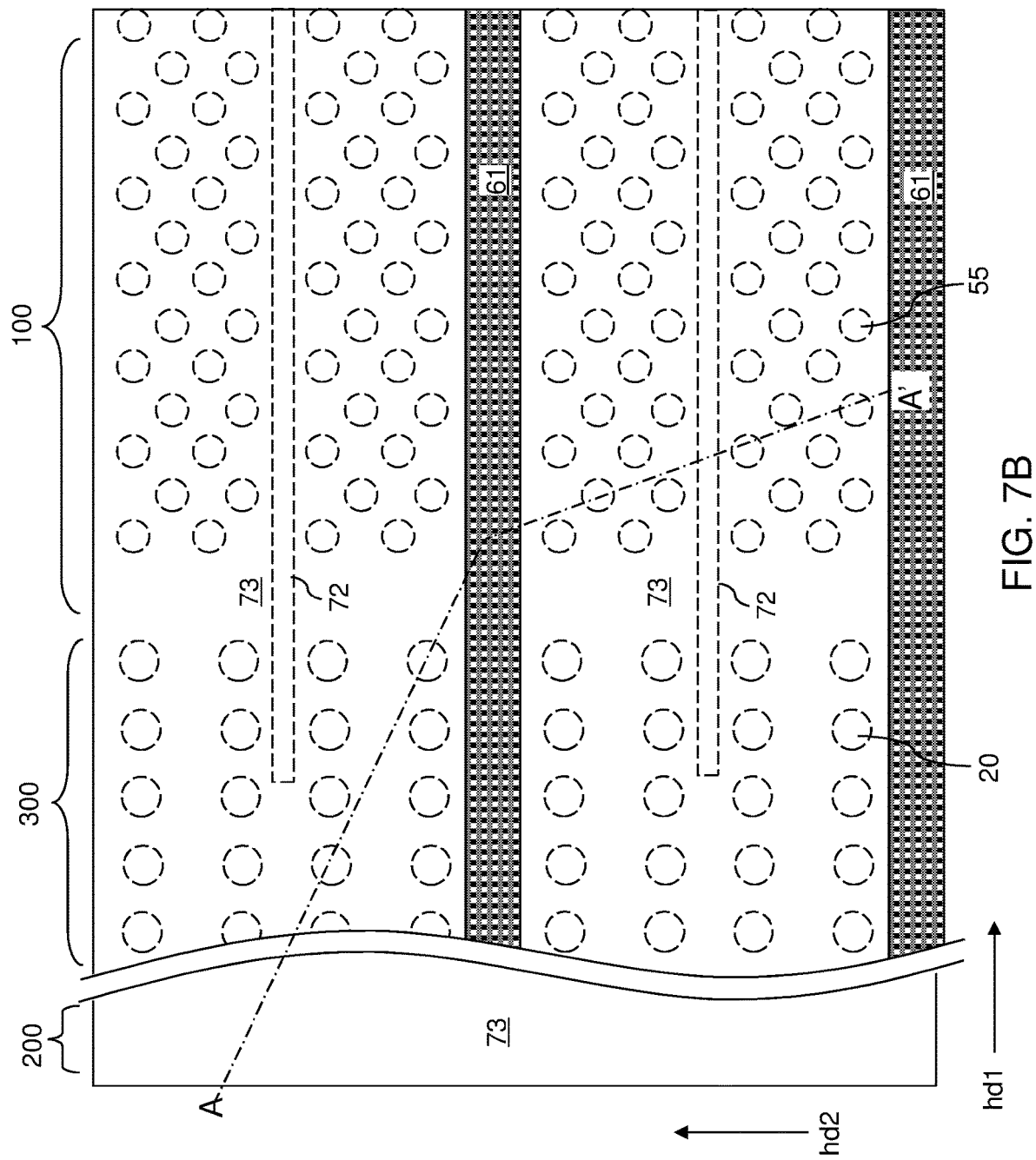
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into surface portions of the semiconductor material layer 10 by an ion implantation process. Source regions 61 can be formed directly underneath each backside trench 79. Atomic concentration of dopants of the second conductivity type in the source regions 61 can be in a range from $5.0 \times 10^{19}/cm^3$ to $2.0 \times 10^{21}/cm^3$, although lesser and greater atomic concentrations can also be employed. An upper portion of the semiconductor material layer 10 that extends between the source region 61 and the vertical semiconductor channels 60 constitutes a horizontal semiconductor channel 59 for a plurality of field effect transistors including a respective vertical semiconductor channel 60.

Figure 8:
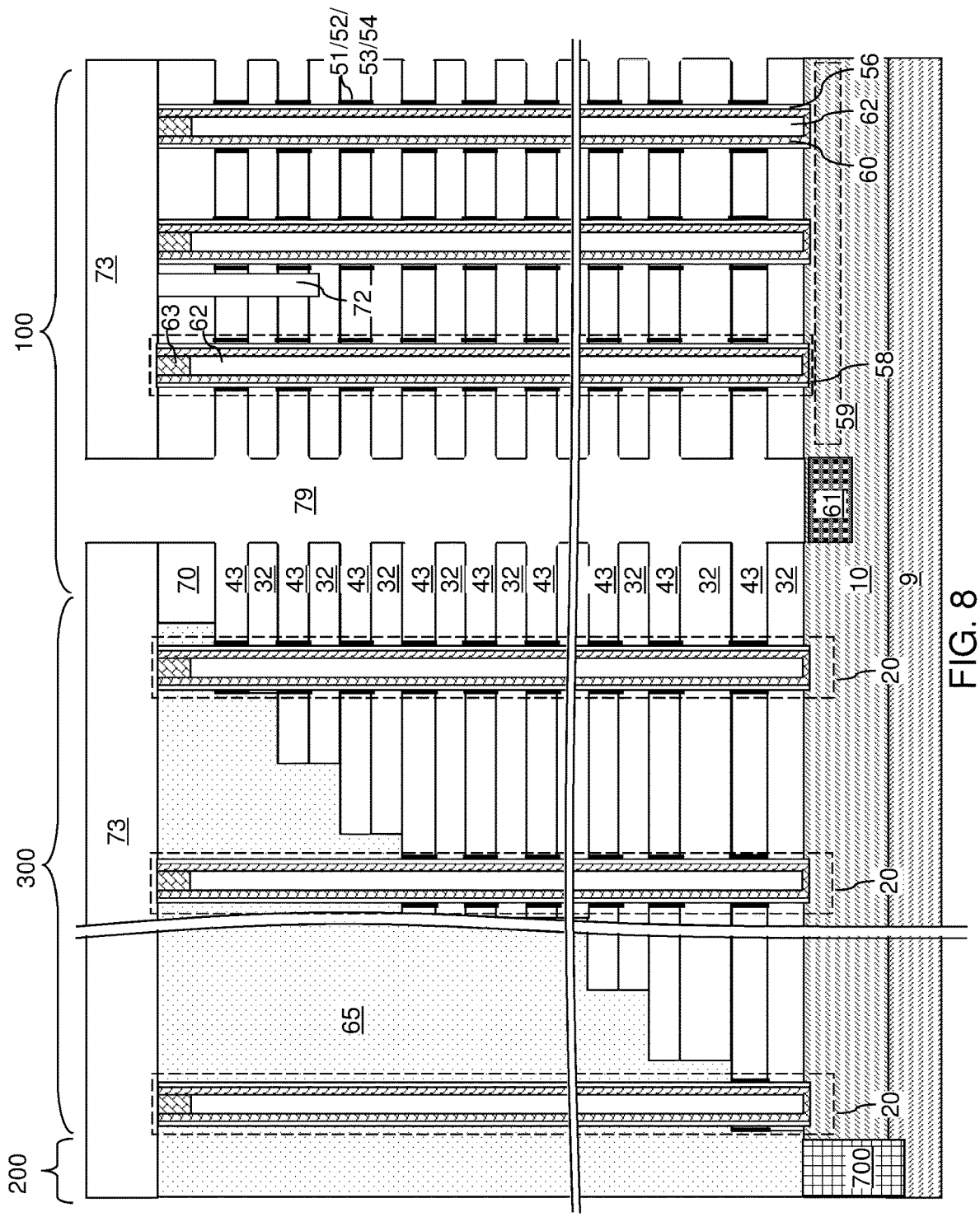
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, the material of the tubular semiconductor oxide spacers 51, and the material of the source regions 61. In one embodiment, the sacrificial material layers 42 can include silicon nitride, and the materials of the insulating layers 32 and the retro-stepped dielectric material portion 65 can be selected from silicon oxide and dielectric metal oxides. The tubular semiconductor oxide spacers 51 can include silicon oxide.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include undoped amorphous silicon or undoped polysilicon, the etch process can be a wet etch process employing hot trimethyl-2 hydroxyethyl ammonium hydroxide ("hot TMY") or tetramethyl ammonium hydroxide (TMAH). The source regions 61 can provide a significantly lower etch rate than the sacrificial material layers 42 during the wet etch process due to a high atomic concentration of dopants of the second conductivity type therein. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

In one embodiment, the sacrificial material layers 42 can include a semiconductor material that is removed selective to the material of the insulating layers 32 and selective to the tubular semiconductor oxide spacers 51. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Referring to FIG. 9B, a wet etch process employing dilute hydrofluoric acid can be performed to remove the tubular semiconductor oxide spacers 51 selective to the tubular aluminum oxide spacers 52. The duration of the wet etch process can be selected to completely remove the tubular semiconductor oxide spacers 51 while minimizing collateral etching of the insulating layers 32 and the insulating cap layer 70. Outer sidewalls of the tubular aluminum oxide spacers 52 can be physically exposed by removing the tubular semiconductor oxide spacers 51.

Referring to FIG. 9C, a metallic barrier layer 46A can be deposited in the backside recesses 43. The metallic barrier layer 46A can be deposited directly on horizontal surfaces of the insulating layers 32 and the outer sidewalls of the tubular aluminum oxide spacers 52. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
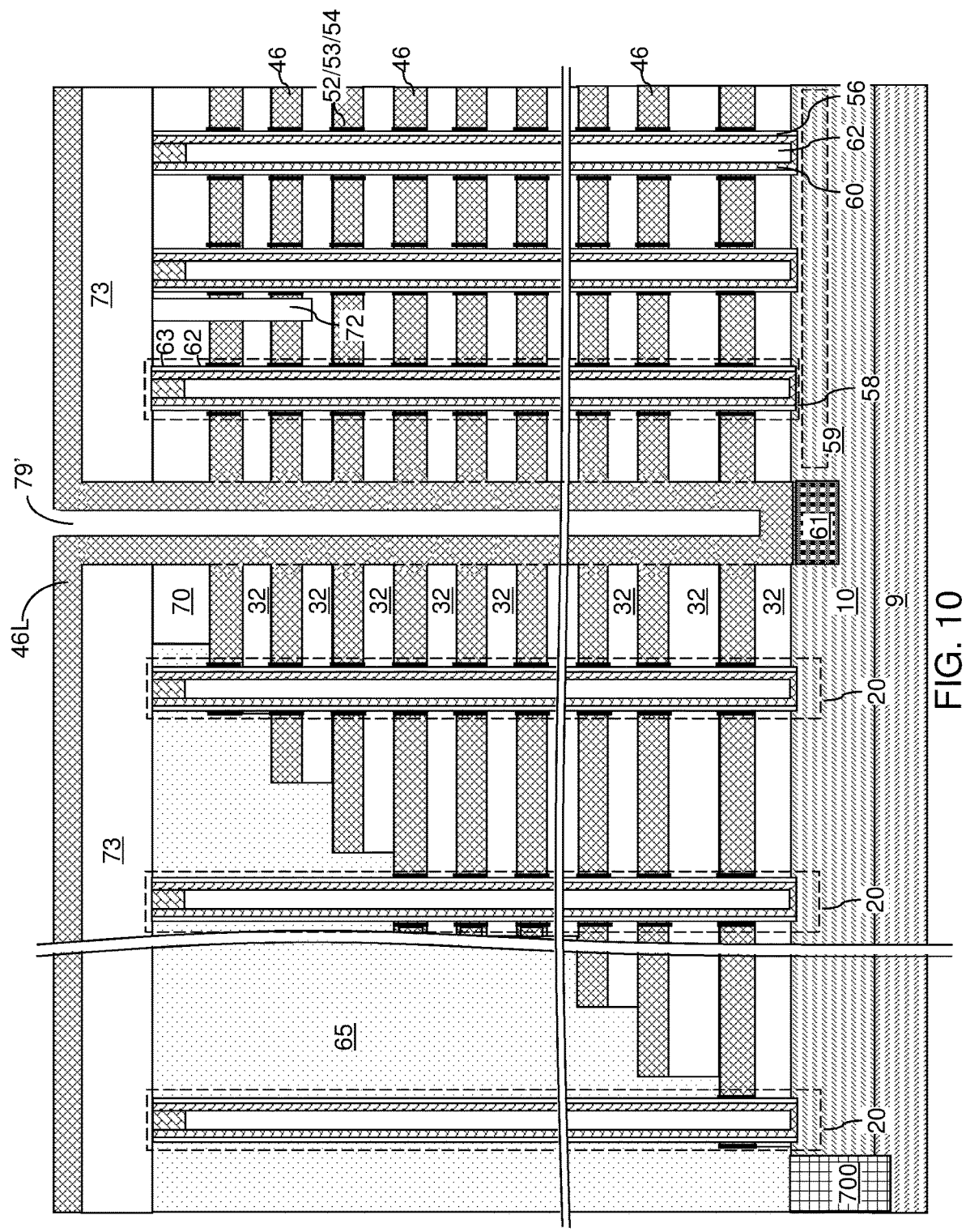
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73. Each sacrificial material layer 42 can be replaced with an electrically conductive layer 46.

Figure 11A:
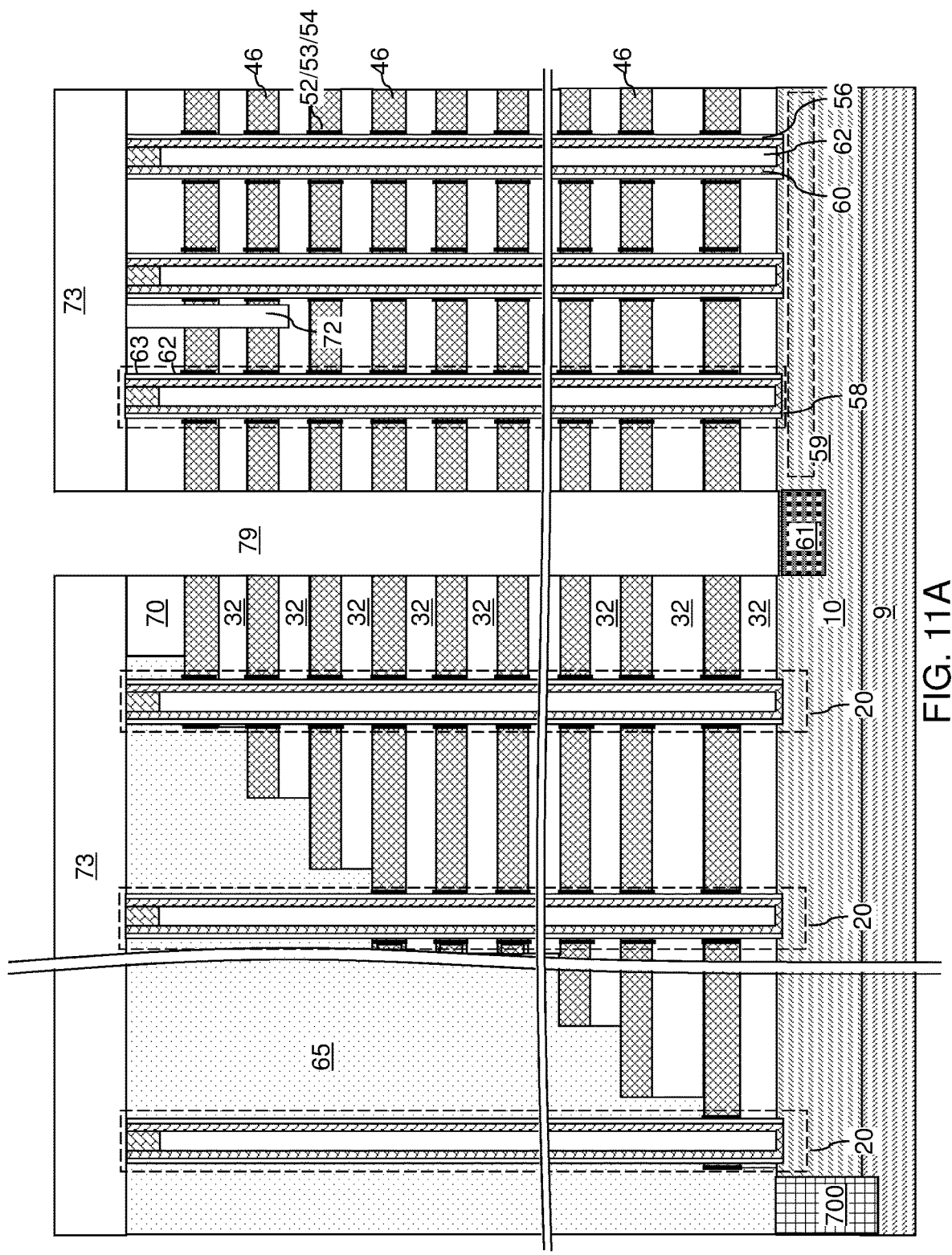
FIG. 11A is a schematic vertical cross-sectional view of the exemplary structure after removal of a deposited conductive material from within the backside trench according to an embodiment of the present disclosure.
Figure 11B:
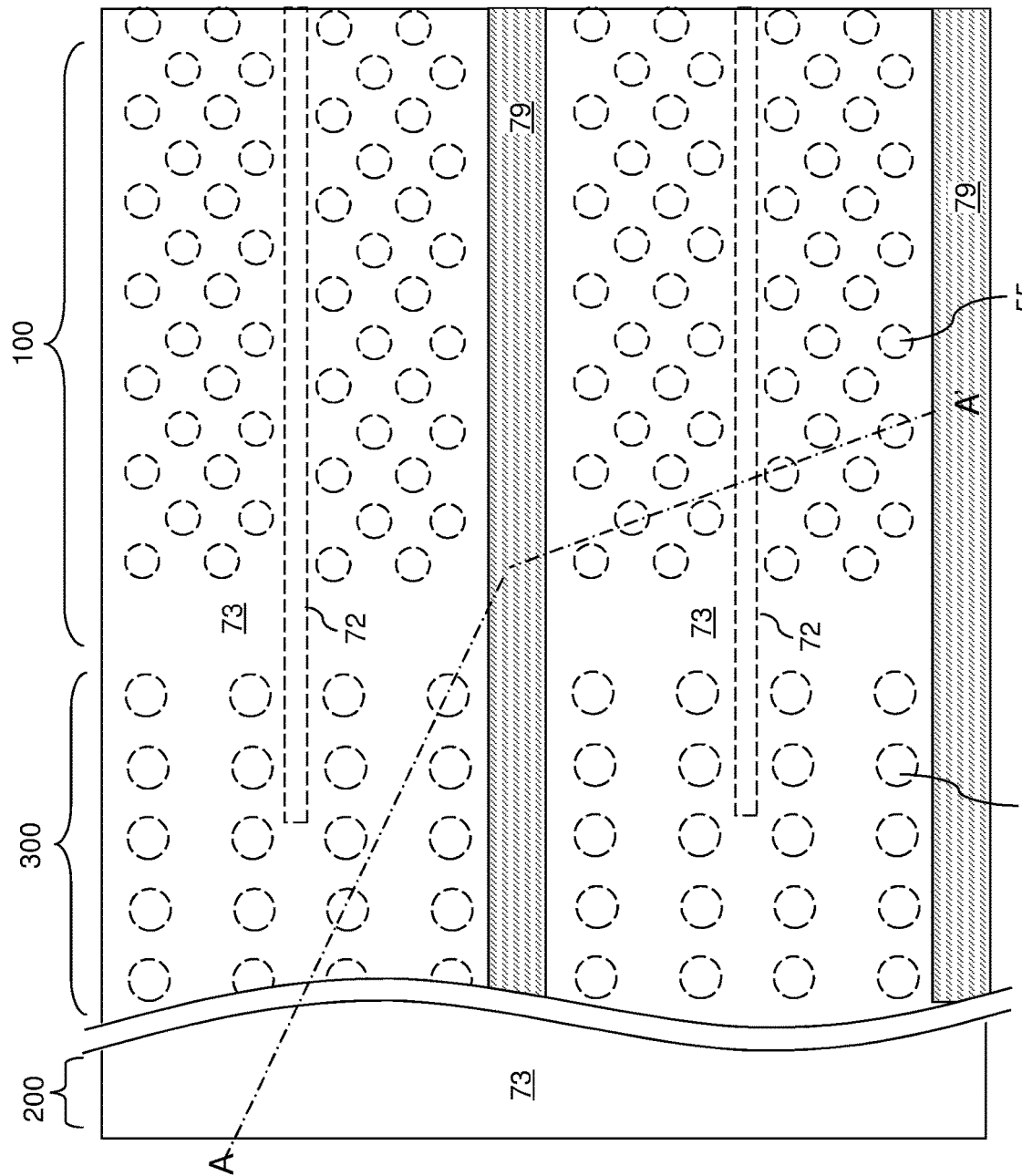
FIG. 11B is a partial see-through top-down view of the exemplary structure of FIG. 11A. The vertical plane A-A' is the plane of the schematic vertical cross-sectional view of FIG. 11A.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 12A:
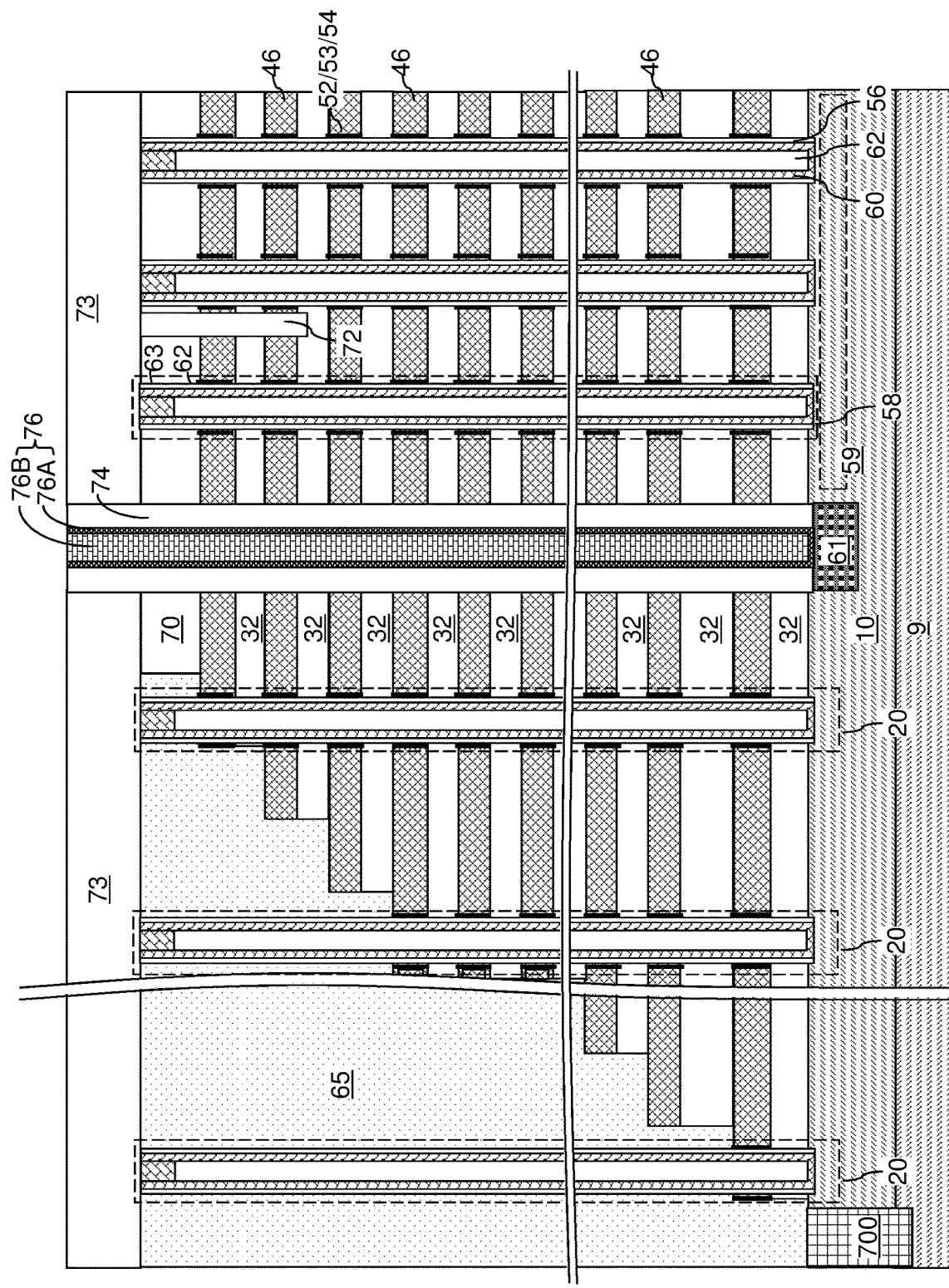
FIG. 12A is a schematic vertical cross-sectional view of the exemplary structure after formation of an insulating spacer and a backside contact structure according to an embodiment of the present disclosure.
Figure 12B:
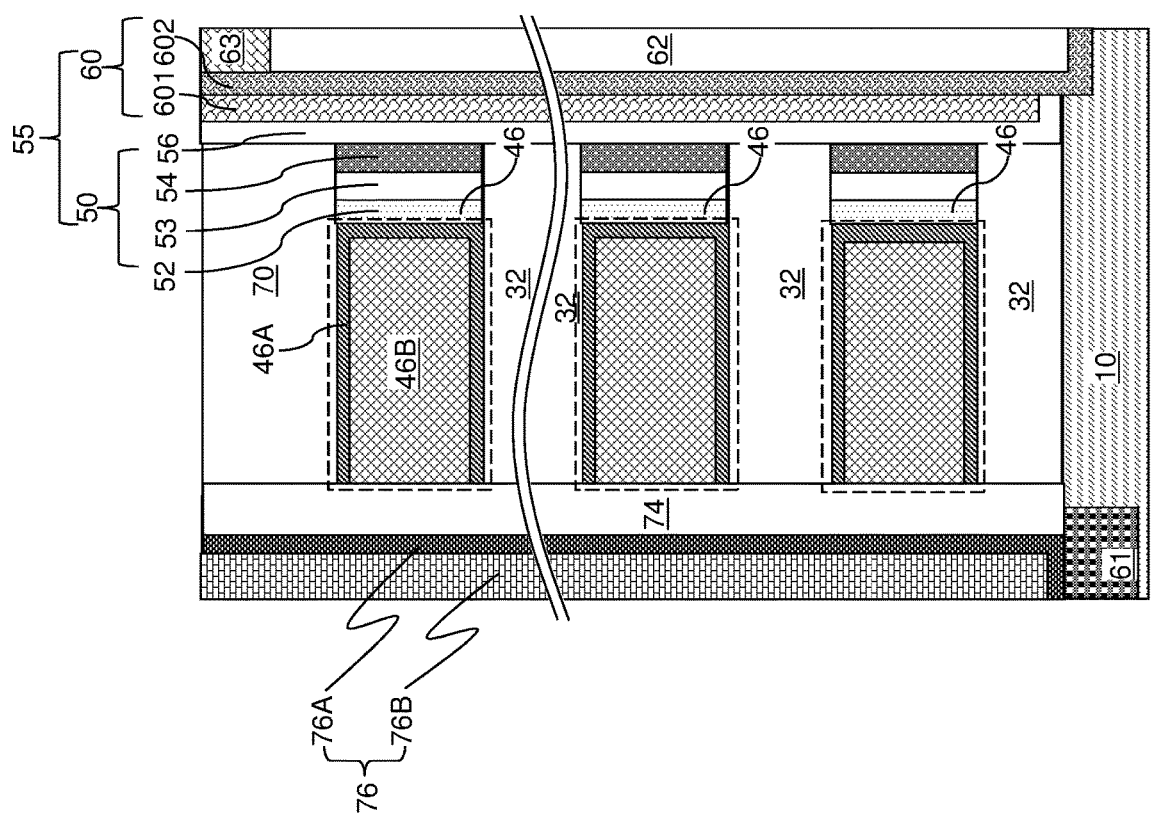
FIG. 12B is a magnified view of a region of the exemplary structure of FIG. 12A.

Referring to FIGS. 12A and 12B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 60) extend between each source region 61 and a respective set of drain regions 63. The semiconductor channels (59, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. Each backside contact via structure 76 extends through the alternating stack (32, 46), and contacts a top surface of a respective source region 61.

Figure 13A:
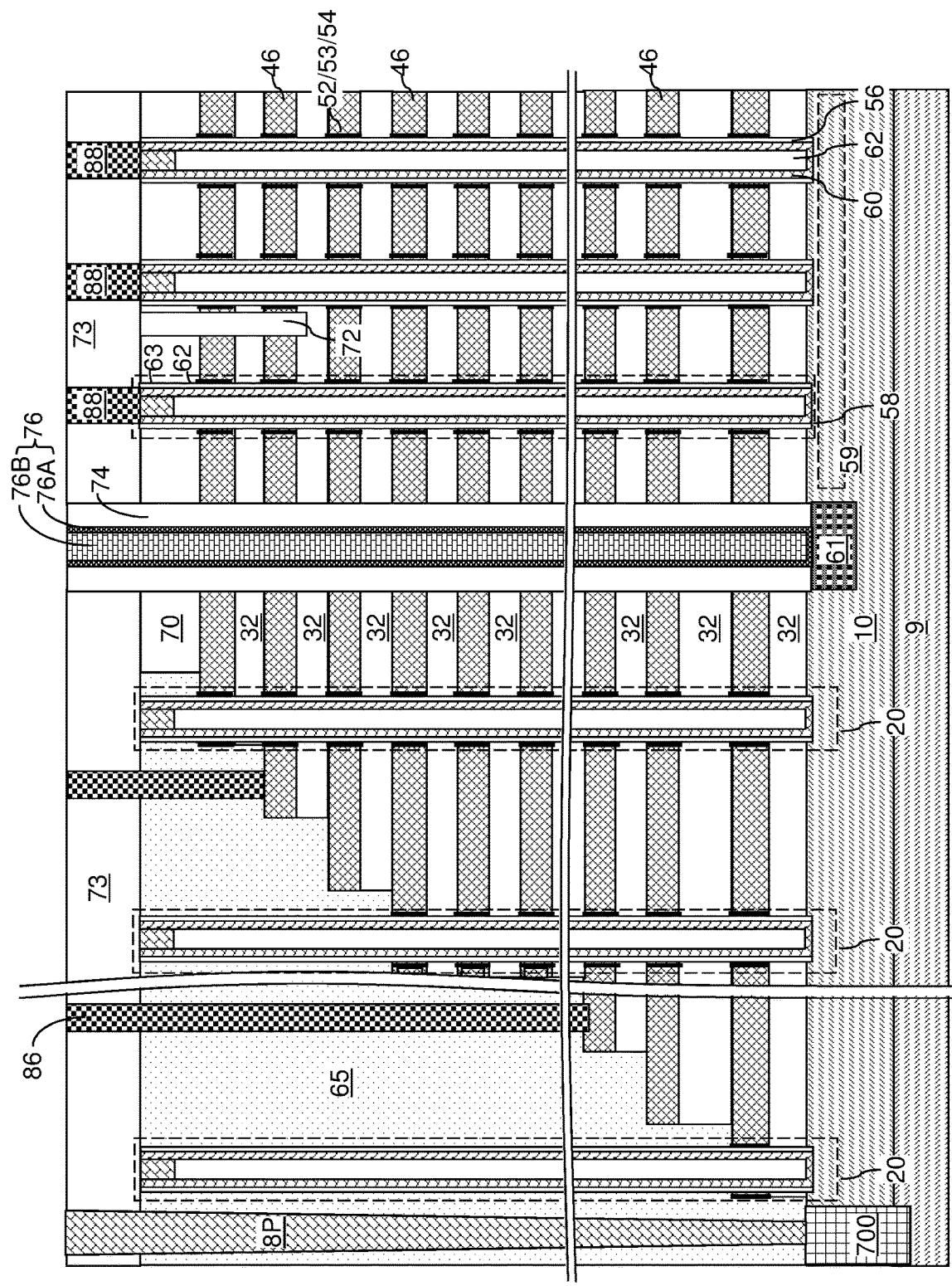
FIG. 13A is a schematic vertical cross-sectional view of the exemplary structure after formation of additional contact via structures according to an embodiment of the present disclosure.
Figure 13B:
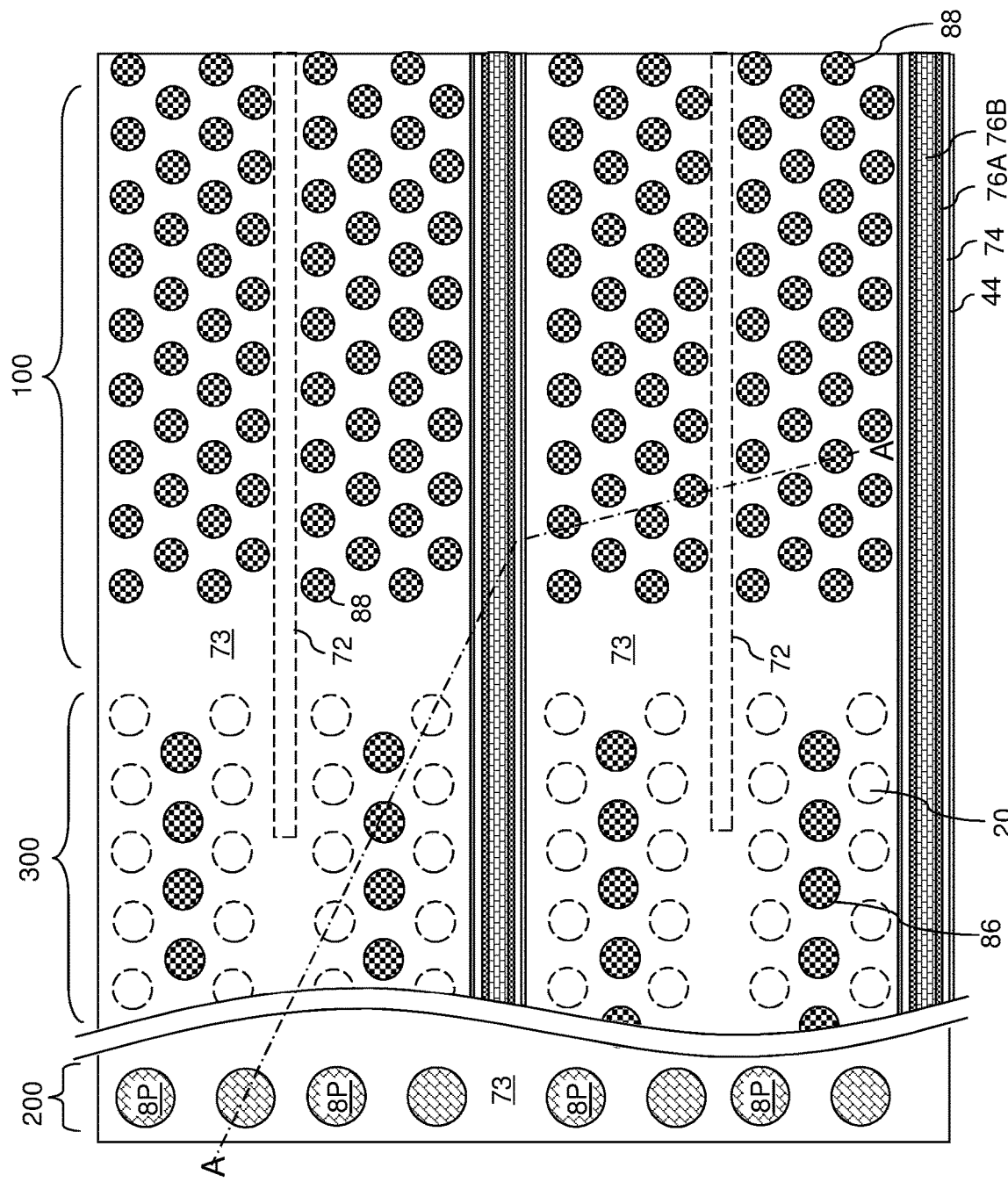
FIG. 13B is a top-down view of the exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a memory device is provided, which comprises: an alternating stack of insulating layers 32 and electrically conductive layers 46 located over a substrate (9, 10); and a memory stack structure 55 extending through the alternating stack (32, 46) and comprising a vertical semiconductor channel 60, a tunneling dielectric layer 56 extending through multiple electrically conductive layers 46 within the alternating stack (32, 46), and a vertical stack of discrete, vertically separated nested tubular structures (52, 53, 54), wherein each nested tubular structure (52, 53, 54) comprises: a tubular charge storage spacer 54 contacting a portion of an outer sidewall of the tunneling dielectric layer 56; a tubular silicon oxide spacer 53 contacting the tubular charge storage spacer 54; and a tubular aluminum oxide spacer 52 contacting the tubular silicon oxide spacer 53.

In one embodiment, each of the tubular charge storage spacers 54 has a respective annular top surface that contacts a respective overlying one of the insulating layers 32 and has a respective annular bottom surface that contacts a respective underlying one of the insulating layers 32. In one embodiment, each of the tubular silicon oxide spacers 53 has a respective annular top surface that contacts a respective overlying one of the insulating layers 32 and has an annular bottom surface that contacts a respective underlying one of the insulating layers 32. In one embodiment, each of the tubular aluminum oxide spacers 53 has a respective annular top surface that contacts a respective overlying one of the insulating layers 32 and has an annular bottom surface that contacts a respective underlying one of the insulating layers 32.

In one embodiment, the tubular charge storage spacer 54, the tubular silicon oxide spacer 53, and the tubular aluminum oxide spacer 52 within each nested tubular structure (52, 53, 54) have a uniform (same) height throughout.

In one embodiment, each of the tubular charge storage spacer 54, the tubular silicon oxide spacer 53, and the tubular aluminum oxide spacer 52 within each nested tubular structure (52, 53, 54) has a respective uniform lateral thickness throughout.

In one embodiment, an outer sidewall of the tunneling dielectric layer 56 vertically extends straight from a topmost one of the electrically conductive layers 46 to a bottommost one of the electrically conductive layers 46. Each inner sidewall of the tubular charge storage spacers 54 in the nested tubular structures (52, 53, 54) is in direct contact with the outer sidewall of the tunneling dielectric layer 56.

In one embodiment, each tubular charge storage spacer 54 in the nested tubular structures (52, 53, 54) consists essentially of silicon nitride. In one embodiment, the memory device comprises a dielectric core 62 that is laterally surrounded by the memory stack structure 55; a drain region 63 overlying the dielectric core 62 and contacting a top end of the vertical semiconductor channel 60; and a semiconductor material layer 10 located in an upper portion of the substrate (9, 10) and contacting, or electrically connected to, a bottom end of the vertical semiconductor channel 60.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces In one embodiment, the memory device comprises plural memory stack structures 55 arranged in a two-dimensional array and extending through the alternating stack (32, 46); the two-dimensional array of memory stack structures 55 comprises a three-dimensional array of memory elements; the electrically conductive layers 46 comprise, or are electrically connected to, a respective word line of the three-dimensional array of memory elements; and each of the memory elements comprises a discrete, respective tubular charge storage spacer 54.

Each nested tubular structure (52, 53, 54) of the embodiments of the present disclosure can include a stack of a tubular silicon oxide spacer 53 and a tubular aluminum oxide spacer 52, which function as a discrete backside blocking dielectric material stack that provides electrical isolation between a discrete tubular charge storage spacer 54 and an electrically conductive layer 46 (e.g., word line/control gate electrode). The discrete tubular charge storage spacers 54 reduce or eliminate undesirable stored charge (e.g., electron) vertical diffusion/drift between adjacent memory cells that may be present in a continuous charge storage layer. Furthermore, the entire volume of each backside recess 43 can be filled with a respective electrically conductive layer 46. Accordingly, the thickness of the sacrificial material layers 42 can be vertically scaled without allowing for a volume for a backside blocking dielectric layer. Thus, the device structure of the present disclosure facilitates scaling of a three-dimensional memory array by eliminating the need to form a backside blocking dielectric layer in each backside recess 43.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising:
    an alternating stack of insulating layers and electrically conductive layers located over a substrate; and
    a memory stack structure extending through the alternating stack and comprising a vertical semiconductor channel, a tunneling dielectric layer extending through multiple electrically conductive layers within the alternating stack, and a vertical stack of discrete, vertically separated nested tubular structures,
    wherein each nested tubular structure comprises:
    a tubular charge storage spacer contacting a portion of an outer sidewall of the tunneling dielectric layer;
    a tubular silicon oxide spacer contacting the tubular charge storage spacer; and
    a tubular aluminum oxide spacer contacting the tubular silicon oxide spacer;
    wherein:
    the memory device comprises plural memory stack structures arranged in a two-dimensional array and extending through the alternating stack;
    two-dimensional array of memory stack structures comprises a three-dimensional array of memory elements;
    the electrically conductive layers comprise, or are electrically connected to, a respective word line of the three-dimensional array of memory elements; and
    each of the memory elements comprises a respective tubular charge storage spacer.

2. The memory device of claim 1, wherein each of the tubular charge storage spacers has a respective annular top surface that contacts a respective overlying one of the insulating layers and has a respective annular bottom surface that contacts a respective underlying one of the insulating layers.

3. The memory device of claim 2, wherein each of the tubular silicon oxide spacers has a respective annular top surface that contacts a respective overlying one of the insulating layers and has an annular bottom surface that contacts a respective underlying one of the insulating layers.

4. The memory device of claim 3, wherein each of the tubular aluminum oxide spacers has a respective annular top surface that contacts a respective overlying one of the insulating layers and has an annular bottom surface that contacts a respective underlying one of the insulating layers.

5. The memory device of claim 1, wherein the tubular charge storage spacer, the tubular silicon oxide spacer, and the tubular aluminum oxide spacer within each nested tubular structure have a uniform height throughout.

6. The memory device of claim 1, wherein each of the tubular charge storage spacer, the tubular silicon oxide spacer, and the tubular aluminum oxide spacer within each nested tubular structure has a respective uniform lateral thickness throughout.

7. The memory device of claim 1, an outer sidewall of the tunneling dielectric layer vertically extends straight from a topmost one of the electrically conductive layers to a bottommost one of the electrically conductive layers.

8. The memory device of claim 7, wherein each inner sidewall of the tubular charge storage spacers in the nested tubular structures is in direct contact with the outer sidewall of the tunneling dielectric layer.

9. The memory device of claim 1, wherein each tubular charge storage spacer in the nested tubular structures consists essentially of silicon nitride.

10. The memory device of claim 1, further comprising:
    a dielectric core that is laterally surrounded by the memory stack structure;
    a drain region overlying the dielectric core and contacting a top end of the vertical semiconductor channel; and
    a semiconductor material layer located in an upper portion of the substrate and contacting, or electrically connected to, a bottom end of the vertical semiconductor channel.

11. The memory device of claim 1, wherein:
    the alternating stack comprises a terrace region in which each electrically conductive layer other than a topmost electrically conductive layer within the alternating stack laterally extends farther than any overlying electrically conductive layer within the alternating stack;
    the terrace region includes stepped surfaces of the alternating stack that continuously extend from a bottommost layer within the alternating stack to a topmost layer within the alternating stack; and
    support pillar structures extend through the stepped surfaces and through a retro-stepped dielectric material portion that overlies the stepped surfaces.

* * * * *